(12) United States Patent
Dahm et al.

(10) Patent No.: US 8,047,686 B2
(45) Date of Patent: Nov. 1, 2011

(54) MULTIPLE LIGHT-EMITTING ELEMENT HEAT PIPE ASSEMBLY

(76) Inventors: Jonathan S. Dahm, Key Largo, FL (US); Mark Paul Jongewaard, Arvada, CO (US)

( * ) Notice: Subject to any disclaimer, the term of this patent is extended or adjusted under 35 U.S.C. 154(b) by 0 days.

(21) Appl. No.: 11/849,147

(22) Filed: Aug. 31, 2007

(65) Prior Publication Data
US 2008/0205062 A1     Aug. 28, 2008

(51) Int. Cl.
*F21V 29/00* (2006.01)
*F21V 5/00* (2006.01)
*F21V 7/20* (2006.01)
*B60Q 1/06* (2006.01)

(52) U.S. Cl. ......... 362/294; 362/580; 362/345; 362/373

(58) Field of Classification Search .................... 362/94, 362/580, 345, 373
See application file for complete search history.

(56) References Cited

U.S. PATENT DOCUMENTS

| | | |
|---|---|---|
| 398,383 A | 2/1889 | Crommer |
| 3,327,712 A | 6/1967 | Kaufman et al. |
| 3,512,027 A | 5/1970 | Kupsky |
| 3,548,930 A | 12/1970 | Byrd |
| 3,603,382 A | 9/1971 | Paine et al. |
| 3,638,013 A | 1/1972 | Keller |
| 3,677,329 A | 7/1972 | Kirkpatrick |
| 3,681,592 A | 8/1972 | Hugelshofer |
| 3,712,984 A | 1/1973 | Lienhard |
| 3,714,981 A | 2/1973 | Noren |
| 3,733,481 A | 5/1973 | Kuyt |
| 3,811,493 A | 5/1974 | Bilinski et al. |
| 3,868,513 A | 2/1975 | Gonser |
| 3,872,463 A | 3/1975 | Lapeyre |
| 3,952,798 A | 4/1976 | Jacobson et al. |
| 3,970,856 A | 7/1976 | Mahaffey et al. |
| 4,048,490 A | 9/1977 | Troue |
| 4,114,274 A | 9/1978 | Jones |
| 4,114,946 A | 9/1978 | Hoffmeister et al. |
| 4,149,086 A | 4/1979 | Nath |
| 4,184,196 A | 1/1980 | Moret et al. |
| 4,185,891 A | 1/1980 | Kaestner |
| 4,186,748 A | 2/1980 | Schlager |
| 4,209,907 A | 7/1980 | Tsukada et al. |
| 4,229,658 A | 10/1980 | Gonser |
| 4,230,453 A | 10/1980 | Reimers |
| 4,233,649 A | 11/1980 | Scheer et al. |
| 4,280,273 A | 7/1981 | Vincent |
| 4,298,806 A | 11/1981 | Herold |
| 4,337,759 A | 7/1982 | Popovich et al. |
| 4,346,329 A | 8/1982 | Schmidt |
| 4,385,344 A | 5/1983 | Gonser |

(Continued)

FOREIGN PATENT DOCUMENTS

CA     2190225     6/1997

(Continued)

*Primary Examiner* — Jong-Suk (James) Lee
*Assistant Examiner* — David J Makiya
(74) *Attorney, Agent, or Firm* — Lando & Anastasi, LLP

(57) ABSTRACT

The present invention provides an optical device comprising one or more heat pipes with a desired level of thermal coupling with the light-emitting elements which are positioned along a periphery of the evaporator surface portion of the heat pipe in such a way that they are thermally coupled to the heat pipe. In one embodiment, the heat pipe of the present invention can be readily integrated with optical elements such as reflectors or collimators.

25 Claims, 23 Drawing Sheets

U.S. PATENT DOCUMENTS

| | | |
|---|---|---|
| 4,391,588 A | 7/1983 | Matsui |
| 4,398,885 A | 8/1983 | Logé et al. |
| 4,412,134 A | 10/1983 | Herold et al. |
| 4,445,858 A | 5/1984 | Johnson |
| 4,450,139 A | 5/1984 | Bussière et al. |
| 4,610,630 A | 9/1986 | Betush |
| 4,666,406 A | 5/1987 | Kanca, III |
| 4,671,349 A | 6/1987 | Wolk |
| 4,673,353 A | 6/1987 | Nevin |
| 4,675,785 A | 6/1987 | Young |
| 4,716,296 A | 12/1987 | Bussière et al. |
| 4,729,076 A | 3/1988 | Masami et al. |
| 4,742,432 A | 5/1988 | Thillays et al. |
| 4,757,381 A | 7/1988 | Cooper et al. |
| 4,791,634 A | 12/1988 | Miyake |
| 4,792,692 A | 12/1988 | Herold et al. |
| 4,810,194 A | 3/1989 | Snedden |
| 4,822,335 A | 4/1989 | Kawai et al. |
| 4,826,431 A | 5/1989 | Fujimura et al. |
| 4,836,782 A | 6/1989 | Gonser |
| 4,839,566 A | 6/1989 | Herold et al. |
| 4,845,405 A | 7/1989 | Yamane et al. |
| 4,846,546 A | 7/1989 | Cuda |
| 4,857,801 A | 8/1989 | Farrell |
| 4,888,489 A | 12/1989 | Bryan |
| 4,893,354 A | 1/1990 | Janzen et al. |
| 4,901,324 A | 2/1990 | Martin |
| 4,935,665 A | 6/1990 | Murata |
| 4,936,808 A | 6/1990 | Lee |
| 4,948,215 A | 8/1990 | Friedman |
| 4,963,798 A | 10/1990 | McDermott |
| 4,999,310 A | 3/1991 | Kim |
| 5,003,434 A | 3/1991 | Gonser et al. |
| 5,007,837 A | 4/1991 | Werly |
| 5,017,140 A | 5/1991 | Ascher |
| 5,029,335 A | 7/1991 | Fisher et al. |
| 5,029,957 A | 7/1991 | Hood |
| 5,046,840 A | 9/1991 | Abbiss et al. |
| 5,070,258 A | 12/1991 | Izumi et al. |
| 5,099,399 A | 3/1992 | Miller et al. |
| 5,115,761 A | 5/1992 | Hood |
| 5,147,204 A | 9/1992 | Patten et al. |
| 5,150,016 A | 9/1992 | Sawase et al. |
| 5,160,200 A | 11/1992 | Cheselske |
| 5,161,879 A | 11/1992 | McDermott |
| 5,162,696 A | 11/1992 | Goodrich |
| 5,169,632 A | 12/1992 | Duell et al. |
| 5,173,810 A | 12/1992 | Yamakawa |
| 5,195,102 A | 3/1993 | McLean et al. |
| 5,198,678 A | 3/1993 | Oppawsky |
| 5,201,655 A | 4/1993 | Friedman |
| 5,233,283 A | 8/1993 | Kennedy |
| 5,242,602 A | 9/1993 | Richardson et al. |
| 5,253,260 A | 10/1993 | Palombo |
| 5,265,792 A | 11/1993 | Harrah et al. |
| 5,268,812 A | 12/1993 | Conte |
| 5,278,629 A | 1/1994 | Schlager et al. |
| 5,283,425 A | 2/1994 | Imamura |
| 5,290,169 A | 3/1994 | Friedman et al. |
| 5,302,124 A | 4/1994 | Lansing et al. |
| 5,309,457 A | 5/1994 | Minch |
| 5,312,249 A | 5/1994 | Kennedy |
| 5,316,473 A | 5/1994 | Hare |
| 5,328,368 A | 7/1994 | Lansing et al. |
| 5,371,753 A | 12/1994 | Adsett |
| 5,371,826 A | 12/1994 | Friedman |
| 5,373,114 A | 12/1994 | Kondo et al. |
| 5,387,800 A | 2/1995 | Kurtich et al. |
| 5,418,384 A | 5/1995 | Yamana et al. |
| 5,420,768 A | 5/1995 | Kennedy |
| 5,445,608 A | 8/1995 | Chen et al. |
| 5,457,611 A | 10/1995 | Verderber |
| 5,471,129 A | 11/1995 | Mann |
| 5,474,449 A | 12/1995 | Loge et al. |
| 5,487,662 A | 1/1996 | Kipke et al. |
| 5,504,764 A | 4/1996 | Pohlmann et al. |
| 5,521,392 A | 5/1996 | Kennedy et al. |
| 5,522,225 A | 6/1996 | Eskandari |
| 5,530,632 A | 6/1996 | Shikano et al. |
| 5,535,230 A | 7/1996 | Abe |
| 5,554,855 A | 9/1996 | Ueno |
| 5,616,141 A | 4/1997 | Cipolla |
| 5,617,492 A | 4/1997 | Beach et al. |
| 5,631,987 A | 5/1997 | Lasky et al. |
| 5,634,711 A | 6/1997 | Kennedy et al. |
| 5,660,461 A | 8/1997 | Ignatius et al. |
| 5,664,042 A | 9/1997 | Kennedy |
| 5,664,864 A | 9/1997 | Kuth |
| 5,698,866 A | 12/1997 | Doiron et al. |
| 5,707,139 A | 1/1998 | Haitz |
| 5,711,665 A | 1/1998 | Adam et al. |
| 5,729,561 A | 3/1998 | Hironaka |
| 5,747,363 A | 5/1998 | Wei et al. |
| 5,759,032 A | 6/1998 | Bartel |
| 5,762,867 A | 6/1998 | D'Silva |
| 5,800,478 A | 9/1998 | Chen et al. |
| 5,803,729 A | 9/1998 | Tsimerman |
| 5,857,767 A | 1/1999 | Hochstein |
| 5,873,645 A | 2/1999 | Belfer |
| 5,912,470 A | 6/1999 | Eibofner et al. |
| 5,928,220 A | 7/1999 | Shimoji |
| 5,949,805 A | 9/1999 | Mordaunt et al. |
| 5,967,653 A | 10/1999 | Miller et al. |
| 5,975,895 A | 11/1999 | Sullivan |
| 6,008,264 A | 12/1999 | Ostler et al. |
| 6,033,223 A | 3/2000 | Narusawa et al. |
| 6,045,240 A | 4/2000 | Hochstein |
| 6,046,460 A | 4/2000 | Mertins |
| 6,065,965 A | 5/2000 | Rechmann |
| 6,068,474 A | 5/2000 | Senn et al. |
| 6,077,073 A | 6/2000 | Jacob |
| 6,086,367 A | 7/2000 | Levy |
| 6,095,812 A | 8/2000 | Senn et al. |
| 6,102,696 A | 8/2000 | Osterwalder et al. |
| 6,113,212 A | 9/2000 | Ng |
| 6,123,545 A | 9/2000 | Eggler et al. |
| 6,159,005 A | 12/2000 | Herold et al. |
| 6,161,937 A | 12/2000 | Rosenstatter |
| 6,168,431 B1 | 1/2001 | Narusawa et al. |
| 6,171,105 B1 | 1/2001 | Sarmadi |
| 6,171,331 B1 | 1/2001 | Bagrev et al. |
| 6,186,786 B1 | 2/2001 | Trushkowsk |
| 6,193,510 B1 | 2/2001 | Tsimerman |
| 6,200,134 B1 | 3/2001 | Kovac et al. |
| 6,208,788 B1 | 3/2001 | Nosov |
| 6,220,722 B1 | 4/2001 | Begemann |
| 6,280,187 B1 | 8/2001 | Slone |
| 6,280,188 B1 | 8/2001 | Ross |
| 6,285,476 B1 | 9/2001 | Carlson et al. |
| 6,331,111 B1 | 12/2001 | Cao |
| 6,345,982 B1 | 2/2002 | Meyer |
| 6,350,041 B1 | 2/2002 | Tarsa et al. |
| 6,371,636 B1 | 4/2002 | Wesson |
| 6,379,149 B1 | 4/2002 | Franetzki |
| 6,402,347 B1 | 6/2002 | Maas et al. |
| 6,419,483 B1 | 7/2002 | Adam et al. |
| 6,439,888 B1 | 8/2002 | Boutoussov et al. |
| 6,468,077 B1 | 10/2002 | Melikechi et al. |
| 6,511,317 B2 | 1/2003 | Melikechi et al. |
| 6,523,959 B2 | 2/2003 | Lee et al. |
| 6,535,533 B2 | 3/2003 | Lorenzen et al. |
| 6,558,829 B1 | 5/2003 | Faris et al. |
| 6,591,898 B1 * | 7/2003 | Chu et al. ............... 165/80.4 |
| 6,676,306 B2 | 1/2004 | Ikeda et al. |
| 6,683,421 B1 | 1/2004 | Kennedy et al. |
| 6,692,251 B1 | 2/2004 | Logan et al. |
| 6,692,252 B2 | 2/2004 | Scott |
| 6,695,614 B2 | 2/2004 | Plank |
| 6,702,576 B2 | 3/2004 | Fischer et al. |
| 6,709,128 B2 | 3/2004 | Gordon et al. |
| 6,719,558 B2 | 4/2004 | Cao |
| 6,719,559 B2 | 4/2004 | Cao |
| 6,755,647 B2 | 6/2004 | Melikechi |
| 6,755,648 B2 | 6/2004 | Cao |
| 6,755,649 B2 | 6/2004 | Cao |
| 6,780,010 B2 | 8/2004 | Cao |
| 6,783,362 B2 | 8/2004 | Cao |

| Patent No. | Date | Inventor |
|---|---|---|
| 6,799,967 B2 | 10/2004 | Cao |
| 6,824,294 B2 | 11/2004 | Cao |
| 6,876,681 B2 | 4/2005 | Nagamatsu |
| 6,910,886 B2 | 6/2005 | Cao |
| 6,918,762 B2 | 7/2005 | Gill et al. |
| 6,926,524 B2 | 8/2005 | Cao |
| 6,929,472 B2 | 8/2005 | Cao |
| 6,932,600 B2 | 8/2005 | Cao |
| 6,953,340 B2 | 10/2005 | Cao |
| 6,955,537 B2 | 10/2005 | Cao |
| 6,969,180 B2 | 11/2005 | Waters |
| 6,969,253 B2 | 11/2005 | Cao |
| 6,971,875 B2 | 12/2005 | Cao |
| 6,971,876 B2 | 12/2005 | Cao |
| 6,974,319 B2 | 12/2005 | Cao |
| 6,979,193 B2 | 12/2005 | Cao |
| 6,979,194 B2 | 12/2005 | Cao |
| 6,981,867 B2 | 1/2006 | Cao |
| 6,986,782 B2 | 1/2006 | Chen et al. |
| 6,988,890 B2 | 1/2006 | Cao |
| 6,988,891 B2 | 1/2006 | Cao |
| 6,991,456 B2 | 1/2006 | Plank |
| 6,994,546 B2 | 2/2006 | Fischer |
| 7,001,057 B2 | 2/2006 | Plank |
| 7,066,733 B2 | 6/2006 | Logan et al. |
| 7,079,391 B2* | 7/2006 | Wellhofer ............... 361/694 |
| 7,198,386 B2* | 4/2007 | Zampini et al. ............ 362/294 |
| 7,225,859 B2* | 6/2007 | Mochizuki et al. ........... 165/10 |
| 7,434,964 B1* | 10/2008 | Zheng et al. ............... 362/294 |
| 7,494,248 B2* | 2/2009 | Li ............................. 362/294 |
| 7,568,817 B2* | 8/2009 | Lee et al. .................... 362/294 |
| 2001/0007739 A1 | 7/2001 | Eibofner et al. |
| 2001/0046652 A1 | 11/2001 | Ostler et al. |
| 2002/0014864 A1 | 2/2002 | Germunder et al. |
| 2002/0048295 A1 | 4/2002 | Kato et al. |
| 2002/0051367 A1 | 5/2002 | Hooker et al. |
| 2002/0054615 A1 | 5/2002 | Nagamatsu et al. |
| 2002/0115037 A1 | 8/2002 | Cao |
| 2002/0133970 A1 | 9/2002 | Gordon et al. |
| 2002/0151941 A1 | 10/2002 | Okawa et al. |
| 2002/0172914 A1 | 11/2002 | Cao |
| 2002/0172918 A1 | 11/2002 | Burtscher et al. |
| 2002/0177096 A1 | 11/2002 | Cao |
| 2002/0181947 A1 | 12/2002 | Cao |
| 2002/0187454 A1 | 12/2002 | Melikechi et al. |
| 2003/0015667 A1 | 1/2003 | MacDougald et al. |
| 2003/0021310 A1 | 1/2003 | Harding |
| 2003/0036031 A1 | 2/2003 | Lieb et al. |
| 2003/0048608 A1* | 3/2003 | Crocker et al. ............. 361/697 |
| 2003/0218880 A1 | 11/2003 | Brukilacchio |
| 2003/0219693 A1 | 11/2003 | Cao |
| 2004/0005524 A1 | 1/2004 | Oxman et al. |
| 2004/0029069 A1 | 2/2004 | Gill et al. |
| 2004/0043351 A1 | 3/2004 | Logan et al. |
| 2004/0054386 A1 | 3/2004 | Martin et al. |
| 2004/0120148 A1* | 6/2004 | Morris et al. ............... 362/264 |
| 2004/0185413 A1 | 9/2004 | Gill et al. |
| 2004/0213016 A1 | 10/2004 | Rice |
| 2005/0003322 A1 | 1/2005 | Logan et al. |
| 2005/0077865 A1 | 4/2005 | Durbin et al. |
| 2005/0082989 A1 | 4/2005 | Jones et al. |
| 2005/0093506 A1 | 5/2005 | Hamada et al. |
| 2005/0096661 A1 | 5/2005 | Farrow |
| 2005/0099824 A1 | 5/2005 | Dowfin et al. |
| 2005/0116176 A1 | 6/2005 | Aquirre |
| 2005/0142514 A1 | 6/2005 | Scott |
| 2005/0158687 A1 | 7/2005 | Dahm |
| 2005/0171408 A1 | 8/2005 | Parker |
| 2005/0196721 A1 | 9/2005 | Jackson |
| 2006/0001384 A1* | 1/2006 | Tain et al. ................... 315/246 |
| 2006/0024638 A1 | 2/2006 | Rosenblood |
| 2006/0092639 A1* | 5/2006 | Livesay et al. ............. 362/294 |
| 2006/0188836 A1 | 8/2006 | Logan et al. |
| 2007/0279862 A1* | 12/2007 | Li ............................. 361/692 |
| 2008/0007954 A1* | 1/2008 | Li ............................. 362/294 |
| 2008/0007955 A1* | 1/2008 | Li ............................. 362/294 |
| 2008/0278954 A1* | 11/2008 | Speier ........................ 362/373 |

FOREIGN PATENT DOCUMENTS

| | | |
|---|---|---|
| DE | 29511927 | 2/1997 |
| DE | 10010638 | 3/2000 |
| EP | 0166405 | 8/1984 |
| EP | 0191500 | 8/1986 |
| EP | 0266038 | 10/1991 |
| EP | 0320080 | 8/1993 |
| EP | 0672435 | 9/1995 |
| EP | 0678282 | 10/1995 |
| EP | 0709698 | 5/1996 |
| EP | 0755662 | 1/1997 |
| EP | 0780103 | 6/1997 |
| EP | 0830851 | 3/1998 |
| EP | 0830852 | 3/1998 |
| EP | 0879582 | 11/1998 |
| EP | 0568666 | 11/1999 |
| EP | 1031326 | 8/2000 |
| EP | 1138276 | 4/2001 |
| EP | 1090607 | 11/2001 |
| EP | 1090608 | 11/2001 |
| EP | 1206923 | 5/2002 |
| EP | 1309048 | 7/2003 |
| EP | 1388326 | 11/2004 |
| GB | 2212010 | 7/1989 |
| GB | 2218636 | 11/1989 |
| GB | 2329756 | 3/1999 |
| JP | 51-42607 | 4/1976 |
| JP | 58-033859 | 2/1983 |
| JP | 61-158980 | 8/1986 |
| JP | 62-0066957 | 3/1987 |
| JP | 63-271983 | 11/1988 |
| JP | 04-066957 | 3/1992 |
| JP | 06-030275 A | 2/1994 |
| JP | 6285508 | 10/1994 |
| JP | 7163863 | 6/1995 |
| JP | 07-240536 | 9/1995 |
| JP | 08-116093 | 5/1996 |
| JP | 8141001 | 6/1996 |
| JP | 09-010238 | 1/1997 |
| JP | 8194786 | 7/1997 |
| JP | 10-033573 A | 2/1998 |
| JP | 2002-111116 | 4/2002 |
| WO | 83/01311 | 4/1983 |
| WO | 84/04463 | 11/1984 |
| WO | 92/02275 | 2/1992 |
| WO | 93/09847 | 5/1993 |
| WO | 93/21842 | 11/1993 |
| WO | 95/07731 | 3/1995 |
| WO | 95/19810 | 7/1995 |
| WO | 95/26217 | 10/1995 |
| WO | 97/36552 | 10/1997 |
| WO | 97/37722 | 10/1997 |
| WO | 97/46279 | 12/1997 |
| WO | 97/46280 | 12/1997 |
| WO | 98/03131 | 1/1998 |
| WO | 98/04317 | 2/1998 |
| WO | 99/09071 | 2/1999 |
| WO | 99/11324 | 3/1999 |
| WO | 99/20346 | 4/1999 |
| WO | 99/35995 | 7/1999 |
| WO | 00/01464 | 1/2000 |
| WO | 00/02491 | 1/2000 |
| WO | 00/13608 | 3/2000 |
| WO | 00/15296 | 3/2000 |
| WO | 00/41726 | 7/2000 |
| WO | 00/41767 | 7/2000 |
| WO | 00/41768 | 7/2000 |
| WO | 00/43067 | 7/2000 |
| WO | 00/43068 | 7/2000 |
| WO | 00/43069 | 7/2000 |
| WO | 00/45733 | 8/2000 |
| WO | 00/67048 | 11/2000 |
| WO | 00/67660 | 11/2000 |
| WO | 01/03770 | 1/2001 |
| WO | 01/14012 | 3/2001 |
| WO | 01/19280 | 3/2001 |
| WO | 01/24724 | 4/2001 |
| WO | 01/54770 | 8/2001 |
| WO | 01/60280 | 8/2001 |

| | | |
|---|---|---|
| WO | 01/64129 | 9/2001 |
| WO | 01/65613 | 9/2001 |
| WO | 01/68035 | 9/2001 |
| WO | 01/69691 | 9/2001 |
| WO | 01/01118 | 11/2001 |
| WO | 02/06723 | 1/2002 |
| WO | 02/13231 | 2/2002 |
| WO | 02/051327 | 7/2002 |
| WO | 02/097501 | 12/2002 |
| WO | 03/096387 | 11/2003 |
| WO | 03/096925 | 11/2003 |
| WO | 03/107440 | 12/2003 |

* cited by examiner

MULTIPLE LIGHT-EMITTING ELEMENT HEAT PIPE ASSEMBLY

FIELD OF THE INVENTION

The present invention pertains to thermal management of light-emitting elements and more particularly to an assembly comprising one or more heat pipes for thermal management of multiple light-emitting elements.

BACKGROUND

Luminaires are employed in a number of lighting applications, such as ambient or space lighting, accent lighting, wall washing, signage, advertising, decorative and display lighting, façade lighting, and custom lighting. Luminaires typically include a number of high-brightness incandescent, fluorescent, neon, or light-emitting diode (LEDs) type light sources coupled to a power management system for supply of energy and control of the desired utility.

A general drawback of high-brightness light sources includes the release of excessive quantities of heat under operating conditions. While being relatively efficient certain LEDs offer high energy densities and generate large amounts of waste heat in small spaces. The use of high-brightness LEDs in illumination applications usually requires some form of temperature control to mitigate the risks of catastrophic failure modes of the LEDs and other components of the luminaire.

Temperature control of LEDs can entail maintaining suboptimal operating conditions below nominal power ratings or, alternatively, improving the rate at which heat can dissipate from the LED or another heat source to a cooler environment. There are a number of solutions known in the art including active and passive cooling including heat sinks and heat pipes. Heat sinks comprise heat-conductive elements that can be thermally coupled to a heat source. The heat sink needs to be thermally coupled to the heat source and the environment; the coupling between the heat sink and the heat source is typically of a conductive nature and the coupling between the heat sink and the environment is typically convective in nature. Heat sinks provide large surfaces to improve cooling efficiency via thermal convection in a proximate space of the environment. Heat sinks typically include a large number of structural cooling elements such as fins, pins or posts to increase the surface area between the heat sink and the environment. Forced convection via fans, for example, can be employed to improve convection and increase the efficiency of the heat sink.

Heat sinks are widely employed for the thermal management of luminaries but their form and use have limited applicability for the direct cooling of LEDs as interferences with the light emission of the LEDs are usually undesired. Heat sinks provide limited heat dispersion capabilities and occupy relatively large spaces in order to work effectively. Heat sinks can only be employed where they can be adequately thermally coupled to LEDs or other heat sources and may therefore be excluded from use in systems with high device integration densities.

A heat pipe is another type of thermal management device. Heat pipes comprise a thermally conductive body in which a certain amount of a heat transfer medium such as a gas, liquid or other fluid is hermetically contained. Heat pipes are intended to rapidly transfer heat from one end to another end of the heat pipe while being relatively small. One end of the heat pipe is thermally coupled to a heat source and the other end can be thermally coupled to a device of lower temperature. One end of the heat pipe typically absorbs thermal energy generated by the heat source, initiating the temperature inside the heat pipe to rise which can cause the heat transfer medium inside the heat pipe to undergo a phase transition, for example the heat transfer medium may evaporate. As a result, the absorbed heat from the heat source provides the energy to overcome the latent heat of the phase transition of the heat transfer medium which in return provides an effective cooling mechanism. Typically the heat transfer medium evaporates and diffuses or buoys away from the heat source, through one or more cavities within the heat pipe to reach a cooler end of the heat pipe where it condenses. Transport of the condensate back to the hot end of the heat pipe is usually either gravitational or aided by capillary effects. Enhanced capillary effects can originate from additional elements which can be disposed inside certain types the heat pipes for example a wicking structure. The condenser end of the heat pipe can be cooled via coupling to a heat sink, for example.

Many known heat pipe designs suffer from a number of deficiencies. Effective heat pipes cannot be built arbitrarily small and often require additional elements such as heat transfer plates when used for cooling relatively small devices in highly integrated systems. Generally, the integration of heat pipe cooling technology in tightly-packaged luminaries can be difficult. Additionally, the charging of heat pipes with cooling media may require controlled pressure conditions during manufacturing. It is difficult in standard heat pipe integration designs to mold heat pipes along with injection molded parts of the luminaire such as optical elements, for example.

Furthermore, every additional component included in the thermal management system increases the complexity of the system design, decreases cost effectiveness and also introduces additional interfaces which can act as a heat flow barrier which can significantly reduce the overall cooling efficiency. For example, LED dies can be mounted on a substrate which can be thermally coupled to a heat spreader plate which itself in return can be thermally coupled to a heat pipe and so forth. Each of these elements needs to be in intimate thermal contact with its adjacent element for the cooling system to work effectively.

There is therefore a need for a thermal management system that offers improved heat transfer efficiency and which can be integrated with optical elements and suitable for use in LED-based luminaries.

This background information is provided to reveal information believed by the applicant to be of possible relevance to the present invention. No admission is necessarily intended, nor should be construed, that any of the preceding information constitutes prior art against the present invention.

SUMMARY OF THE INVENTION

An object of the present invention is to provide a multiple light-emitting element heat pipe assembly. In accordance with one aspect of the present invention, there is provided an optical device comprising: a heat pipe having an evaporator end portion having a perimeter; one or more light-emitting elements for generating light, the one or more light-emitting elements operatively and thermally coupled to the heat pipe at the perimeter of the evaporator end portion.

In accordance with another aspect of the present invention, there is provided an optical device comprising: a plurality of heat pipes each having a evaporator end portion having a perimeter and each of the heat pipes having a condenser end portion, wherein each evaporator end portion of the heat pipes has a cross sectional shape configured to enable compact proximate positioning of the evaporator end portion of each of the heat pipes and wherein each of the plurality of heat pipes are configured to provide spatial separation of each condenser end portion of the heat pipes; one or more light-emitting elements for generating light, wherein one or more light-emitting elements are operatively and thermally coupled to each of the heat pipes at the perimeter of the evaporator end portion.

DETAILED DESCRIPTION OF THE INVENTION

Definitions

Figure 1:
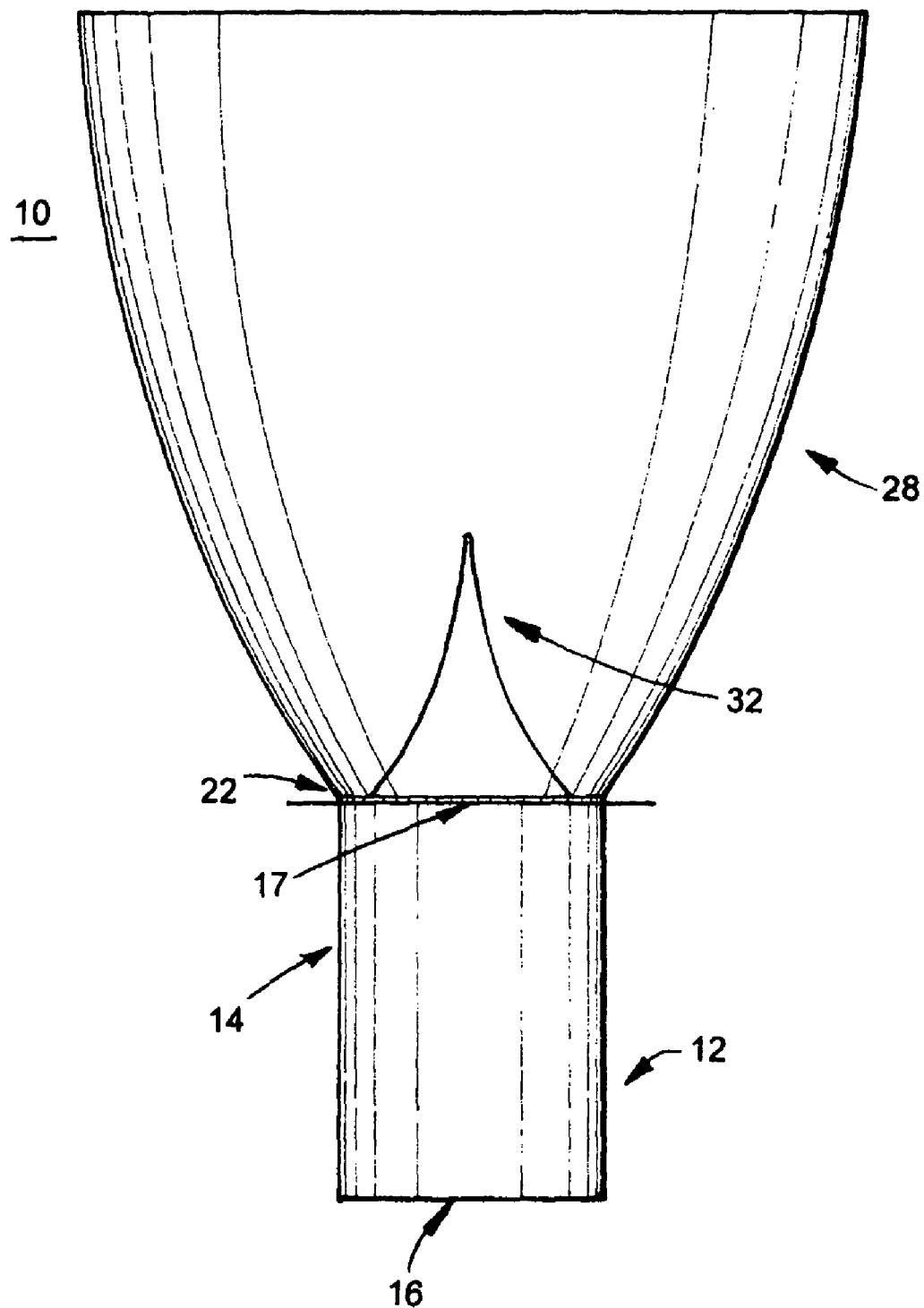
FIG. 1 illustrates a side view of an optical device according to an embodiment of the present invention.

The term "light-emitting diode" (LED) is used to include a general or specific type of LED or laser diode such as resonant cavity LED (RCLED), superluminescent LED (SLLED), organic LED (OLED), flexible OLED (FOLED), Flip Chip LED (FCLED), high-brightness LED or other LED as would be readily understood by a worker skilled in the art.

The term "light-emitting element" (LEE) is used to define a device that emits radiation in a region or combination of regions of the electromagnetic spectrum for example, the visible region, infrared and/or ultraviolet region, when activated by applying a potential difference across it or passing a current through it, for example. Therefore a light-emitting element can have monochromatic, quasi-monochromatic, polychromatic or broadband spectral emission characteristics. Examples of light-emitting elements include semiconductor, organic, or polymer/polymeric light-emitting diodes, optically pumped phosphor coated light-emitting diodes, optically pumped nano-crystal light-emitting diodes or other similar devices as would be readily understood by a worker skilled in the art. Furthermore, the term light-emitting element is used to define the specific device that emits the radiation, for example a LED die, and can equally be used to define a combination of the specific device that emits the radiation together with a housing or package within which the specific device or devices are placed.

The term "optical element" is used to refer to lenses, filters, reflectors, prisms etc that affect the propagation or composition of light as would be readily understood by a worker skilled in the art.

As used herein, the term "about" refers to a +/−10% variation from the nominal value. It is to be understood that such a variation is always included in any given value provided herein, whether or not it is specifically referred to.

Unless defined otherwise, all technical and scientific terms used herein have the same meaning as commonly understood by one of ordinary skill in the art to which this invention belongs.

The present invention arises from the realization that existing optical devices having a heat pipe for cooling light-emitting diodes suffer from the disadvantage that the heat pipe is typically not in intimate thermal contact with the LEDs and cannot be easily integrated with the LEDs, the optical elements and the drive circuitry of a luminaire because they would either obstruct or otherwise undesirably affect the desired light emission or the desired placement of a driving circuit therefor. The present invention provides an optical device comprising one or more heat pipes with a desired level of thermal coupling with the light-emitting elements, wherein the light-emitting elements are positioned along a periphery of the evaporator end portion of the heat pipe in such a way that they are thermally coupled to the heat pipe. In one embodiment, the heat pipe of the present invention can be readily integrated with optical elements such as reflectors or collimators.

The present invention further provides an optical device comprising a plurality of heat pipes configured for substantially intimate placement therebetween of the evaporator surface end portions of the heat pipes. One or more light emitting elements for generating light are thermally coupled to each of the plurality of heat pipes. The one or more light-emitting elements are positioned substantially proximate to the periphery of the evaporator end portion of the heat pipe. The relative positioning and configuration of the heat pipes can enable the reduction of the cross sectional size of the region required for the light-emitting elements, while reducing impediments to the desired light emission for the optical device. In one embodiment, the heat pipe of the present invention can be readily integrated with optical elements such as reflectors or collimators.

Figure 2:
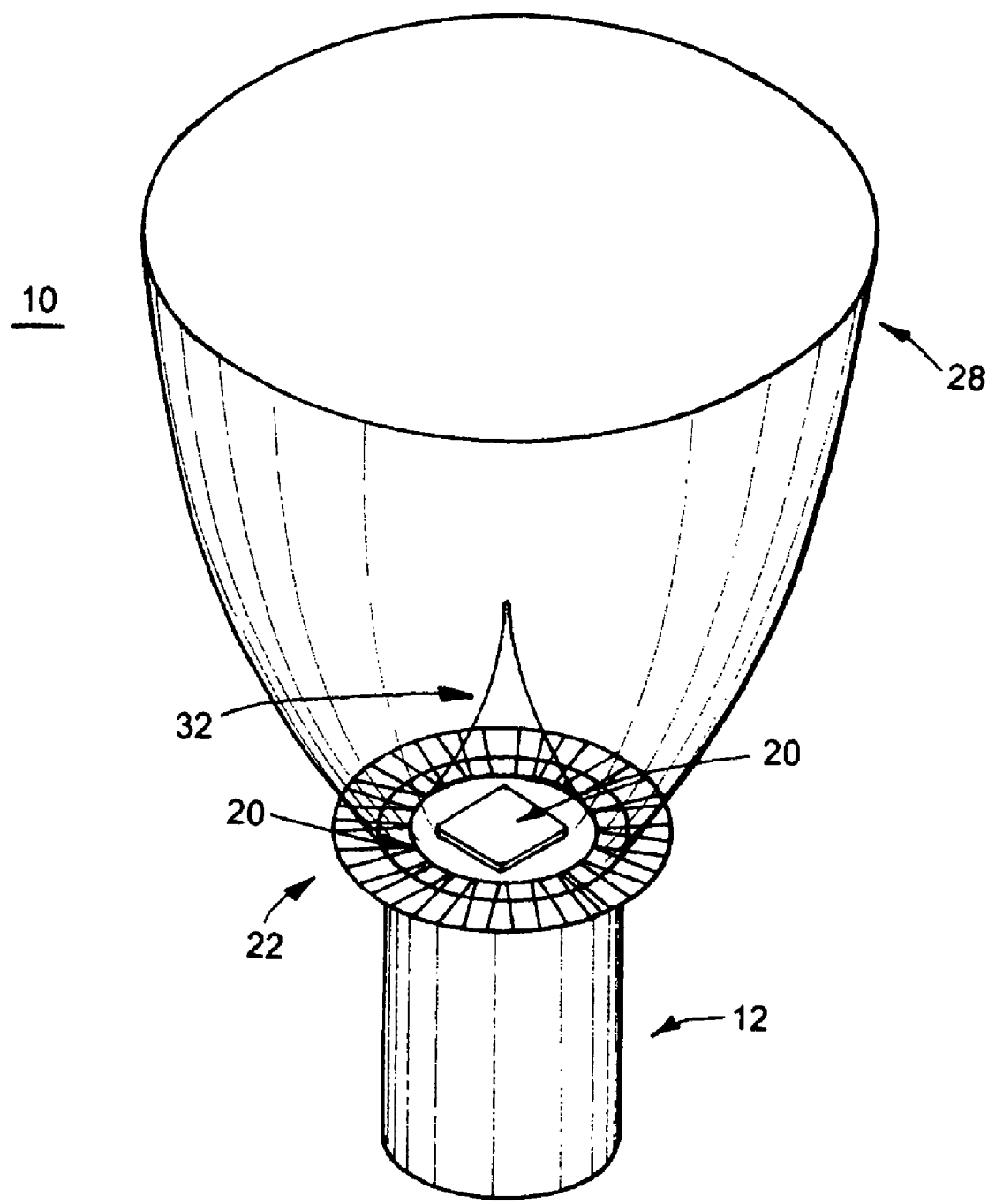
FIG. 2 illustrates a perspective view of the optical device illustrated in FIG. 1.

FIG. 1 and FIG. 2 illustrate an optical device 10 in accordance with an embodiment of the present invention. The optical device 10 includes a heat pipe 12 having an intermediate bulk portion 14, a condenser surface 16 at one end region of the bulk portion 14, and a evaporator surface 17 at an opposite end region of the bulk portion 14. A portion of the bulk portion 14 adjoining the condenser surface 16 may also act as a condenser surface. A number of light-emitting elements 20 are positioned on a substrate 22 wherein the substrate 22 is in thermal contact with the evaporator surface of the heat pipe 12. The optical device further comprises an optical element 28 for the collection, blending and redirection of the light emitted by the light-emitting elements. The optical element 28 can be directly or indirectly attached to the top of the substrate or the light-emitting elements, for example.

In one embodiment of the present invention, the optical device is configured to minimize the etendue thereof. As is known the etendue of an optical device is a constant and is calculated as the product of the opening size of the optical device and the solid angle from which the optical device emits light. The optical device according to the present invention is configured such that the light-emitting elements are mounted in relation to the heat pipe in a configuration that is substantially an optimal balance between opening size and the thermal path length between the light-emitting elements and the sidewall wicking structure of the heat pipe. The circumferential configuration of the light-emitting elements according to one embodiment of the invention has an area that is about 10-20% larger than the area that would result from mounting the light-emitting elements in a square configuration which included the area defined by a circular reflector around the light-emitting elements. A square configuration of light-emitting elements, however, would likely be impractical for electrical interconnections such as wire bonds. Additionally, in a square configuration, the concentration of thermal energy in the central region of the tip of the heat pipe may result in the wicking structure of the heat pipe in this central region drying out, thus resulting in a longer thermal path length to the wicking structure positioned along the interior of the walls of the heat pipe. In addition, this circumferential configuration of the light-emitting elements may reduce thermal cross talk between the light-emitting elements and may provide a more equal distance between the light-emitting elements and a centrally located optical sensor. Finally, color mixing can be increased by arranging the circumferentially positioned light-emitting elements in such a way as to essentially ensure that light-emitting elements of similar emission wavelengths are separated sufficiently.

Heat Pipe

The bulk portion of a heat pipe defines a tubular hollow body which is partially filled with a certain amount of cooling medium, for example ammonia, water or the like. Whenever cooling medium proximate to the evaporator surface evaporates, it migrates inside the heat pipe towards the condenser surface where the cooling medium condenses if the inside of the heat pipe proximate to the condenser surface is of adequate temperature.

The condenser surface can be left exposed to the environment or it can be thermally coupled to a heat sink for cooling of the condenser surface. Under operating conditions the heat pipe comprising the intermediate bulk portion, condenser surface and evaporator surface can form a thermally conductive path for dissipating heat removed away from heat sources such as light-emitting elements which are thermally coupled to the contact surface.

In one embodiment of the present invention the heat pipe can optionally comprise traces or electrical circuitry to provide pathways for providing electrical power or control signals to the light-emitting elements. For example, the bulk portion can be surface patterned with electrically conductive traces. The heat pipe can additionally have layers of dielectric material attached to it which can be used to insulate electrical traces, for example.

In another embodiment of the present invention, there is provided dielectric submounts coupled to the heat pipe, wherein the submounts can be used to support circuit traces, devices etc.

In one embodiment of the present invention, the heat pipe is used as a thermally conductive and electrically passive element. In this embodiment, an electrically passive element can carry effectively no current, but may comprise either or both electrically non-conductive and electrically conductive materials.

In one embodiment of the present invention, the heat pipe is made from a thermally and electrically conducting material, such as aluminum, silver or copper or the like. The heat pipe may be used to provide electricity or act as an electrical contact for anodes or cathodes of the light-emitting elements. Accordingly, an electrically active heat pipe can provide an electrically conductive path for supply of electrical power or control signals to the light-emitting elements.

In one embodiment of the present invention, the evaporator surface comprises a recess area to frictionally fit with the bottom portion of the optical element, thereby providing a means for securing the optical element to the heat pipe. Alternately, the optical element can be secured to the heat pipe directly or indirectly using an adhesive, epoxy or other securing mechanism as would be readily understood.

In one embodiment of the present invention, the heat pipes are strategically shaped in order to provide for the relatively close positioning of the evaporator end portions of heat pipes within an optical device. Furthermore the heat pipes are shaped such that the condenser end portions of the heat pipes are sufficiently spaced apart in order to enable a desired level of heat dissipation from the condenser end portion of the heat pipes.

In one embodiment of the present invention, the evaporator end portions of the heat pipes are positioned in order that a desired separation distance therebetween is provided. In another embodiment of the present invention, the evaporator end portions of the heat pipes are in physical contact. In one embodiment, the relative positioning of the evaporator end portions of the heat pipes is determined based on a desired level of thermal cross talk between the heat pipes.

In one embodiment of the present invention, the cross section shape of a heat pipe at the evaporator end portion of the heat pipe is shaped in order to allow for relative close positioning of adjacent heat pipes. The cross sectional shape of the evaporator end portion of the heat pipe can be tear drop shaped, triangular, hexagonal or other shape as would be readily understood that can enable the relative positioning of a plurality of heat pipes in a reduced area. The shaping of the evaporator end portion of the heat pipes can be formed by pressing or other shaping method as would be readily understood by a worker skilled in the art.

In one embodiment of the present invention, the heat pipes comprise one or more bends which are formed along their length. The one or more bends formed in the heat pipes can enable the desired relative separation of the condenser ends of the heat pipes in order to enable a desired level of heat dissipation thereby. In one embodiment of the present invention, the length of the heat pipes are bent in order that a desired configuration of a heat sink can be thermally coupled thereto in order to provide a desired level of heat transfer from the heat pipes to the heat sink.

In one embodiment of the present invention, the tip of a heat pipe can be fabricated in a two-piece fashion containing the hollow tubular structure lined with the wick, and a separate cap structure that contains the patterning with the light-emitting elements and one or more optical sensors bonded thereto. In one embodiment, the material forming the cap structure is stamped or machined or laser diced copper that has a dielectric, for example atomic layer deposition (ALD) deposited alumina, layer on top, which is then patterned with circuit traces and bond pads. The cap structure can be joined to the tubular body of the heat pipe by laser welding, soldering, or brazing. The tubular body can be evacuated, charged with water or ammonia, and then sealed at the opposite end from the cap structure. This assembly method of the heat pipe can allow for the integration of a relatively simple light-emitting element mounting and electrical inter-connect or wire bonding process.

Light-Emitting Elements and Substrate

For good heat transfer light-emitting elements are positioned proximate to the evaporator surface of the heat pipe.

Figure 3:
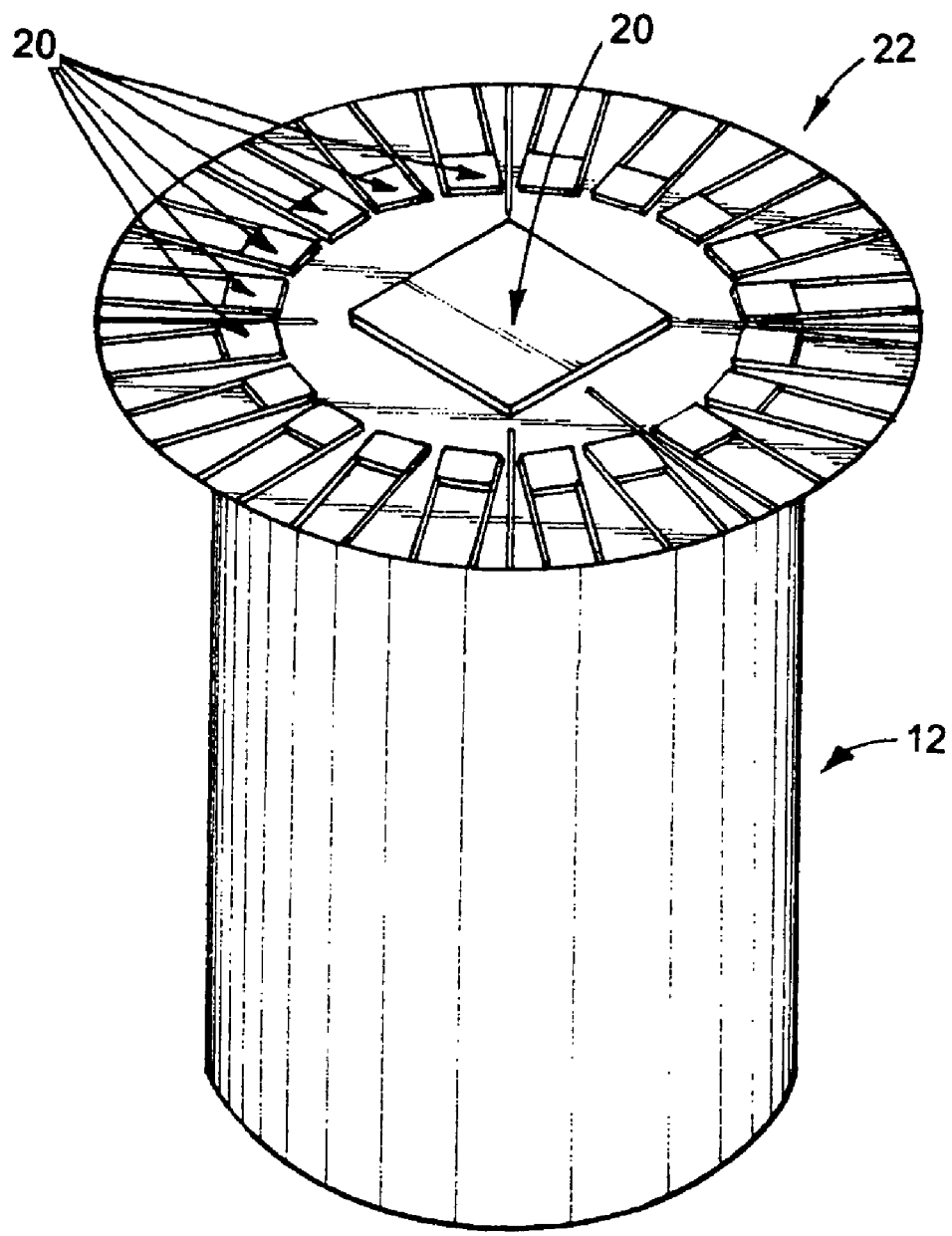
FIG. 3 illustrates a detailed perspective view of the optical device illustrated in FIG. 1 with the optical element removed.

In one embodiment, for example as illustrated in FIG. 3, the light-emitting elements are positioned on a substrate made from or comprising a highly thermally conductive material. The substrate can be made of silicon, copper-plated silicon, aluminum oxide, aluminium nitride, CVD diamond, BeO, GaN, SiC, graphite or diamond-coated silicon as well as from certain metals or ceramics or other thermally conductive materials as would be known to a worker skilled in the art.

In one embodiment, the substrate is made from thin, for example fifty to one hundred microns thick, material such as silicon to give the substrate the required mechanical stability as well as a desired flexibility or elasticity, thermal resistance, and ability for good thermal coupling with the light-emitting elements as well as the heat pipe.

In one embodiment for example as illustrated in FIG. 3, a number of electrically and thermally conductive pads can be disposed along a circumferential marginal area adjacent to the outer edge of the substrate. Each pad can be used to dispose and operatively and thermally connect a light-emitting element, wherein each pad may be shaped to match the contours of a light-emitting element. The pads and the substrate can be configured to maximize the contact surface to the light-emitting elements and to provide a desired thermal coupling with the contact surface of the heat pipe. It is noted that the substrate can be shaped as an ellipse, square, rectangle or other shape as would be readily understood by a worker skilled in the art.

In one embodiment, the substrate provides adequately sized and shaped optically reflective wells or ridges between adjacent pads or in other locations to optically separate and obstruct the optical paths between light-emitting elements. The wells can help suppress the degree to which light-emitting elements absorb light emanating from other light-emitting elements and help improve the light-extraction efficiency of the optical device by redirecting laterally or shallow emitted light from the light-emitting elements in a forward direction.

In one embodiment of the present invention light-emitting elements can be bonded to corresponding pads by a solder or an adhesive such as indium or tin, lead-tin or gold-tin, for example. In another embodiment, the light-emitting elements can be disposed or directly grown by crystallization on the pads. The light-emitting elements can be manufactured, for example, by standard thin or thick film technologies as well as by lithography, chemical vapor deposition (CVD), molecular beam epitaxy (MBE), metal-organic CVD (MOCVD), sputtering or the like in combination with desired structuring methods, for example.

In one embodiment, any required electrically insulating material can be deposited on the substrate using oxides such as aluminum oxide, for example, or any other materials known in the art. Electrically conductive or insulating layers can be deposited and structured into traces employing a number of techniques including thin and thick film technologies as well as sputtering, CVD, MOCVD, MBE or ALD or the like as well as lithography. Any electrically conductive as well as electrically insulating layers provide a desired level of thermal conductivity.

In one embodiment, the substrate can be made of material with an adequate degree of electrical conductivity that yet still provides high thermal conductivity. The substrate can be made of foil or cut from bulk and polished to a desired thickness and surface quality. The substrate can comprise a layer of carbon in a diamond configuration, for example. The substrate surfaces may need to meet certain surface requirements concerning roughness or texture, for example. Depending on its composition, for example copper, silicon or aluminum nitride, the layer of the substrate can be coated with a layer of electrically insulating material of different types, such as aluminum oxide, for example. The circuit traces and bond pads can be formed by lithography on an adequate layer on the substrate. The substrate preferably provides a high quality surface finish, and any optional layer are generally desirably thin.

In an embodiment of the present invention the layer of the substrate that is patterned includes a silver ink. The patterned layer can be stenciled and between approximately one and ten micros thick. For example, it can be printed by a Gravure method. The patterned layer may be less than one micron thick if the ink is only desired to provide a catalyst for subsequent material deposition processes, for example. Generally, substrates and circuits can be manufactured on top of ALD processed copper foil are cost effective and can provide good thermal conductivity and insulate sufficiently well. Adequate deposition technologies are well known in the art. In embodiments of the present invention, thick or thin film patterning may be employed.

Disposing light-emitting elements proximate to the outer edge of the evaporator surface of the heat pipe, for example as illustrated by the configuration in FIGS. 2 and 3, provides improved heat spreading around the evaporator surface. Heat can be dissipated both radially and circumferentially in a substantially uniform manner. Accordingly, the heat generated by the light-emitting elements can be effectively spread along the circumference of the evaporator surface as opposed to being concentrated at a hot zone if the light-emitting elements were otherwise arranged. This configuration can allow the light-emitting elements to be operated at higher drive currents and can also allow for the use of high-brightness, high-power light-emitting elements, for example. Good cooling can enable durable operation of the light-emitting elements even beyond nominal operating conditions without affecting the reliability of the light-emitting elements.

As illustrated in FIG. 3, for example, the optical device may optionally comprise one or more optical sensors 200 for sensing a portion of the light emitted from the light-emitting elements and for monitoring the radiometric characteristics of that light. The optical sensor can be positioned proximate to a central region of the optical element, for example coupled to the centre portion 32 as illustrated. The optical sensor may be operatively coupled to drive circuitry for maintaining the radiometric characteristics of the emitted light by controlling the drive current to the light-emitting elements. The drive circuitry and the optical sensor may be disposed proximate to each other or integrated within the same device. The drive circuitry controls the drive current to the light-emitting elements which can be controlled in any analog or digital fashion including, for example, pulse width modulation (PWM) or pulse code modulation (PCM) or any other adequate method known in the art.

In one embodiment of the present invention, drive circuitry for the light-emitting elements can be disposed on the heat pipe at desired locations or may be operatively coupled to the optical device in order to provide operational control signals to the plurality of light-emitting elements of the optical device.

Figure 4:
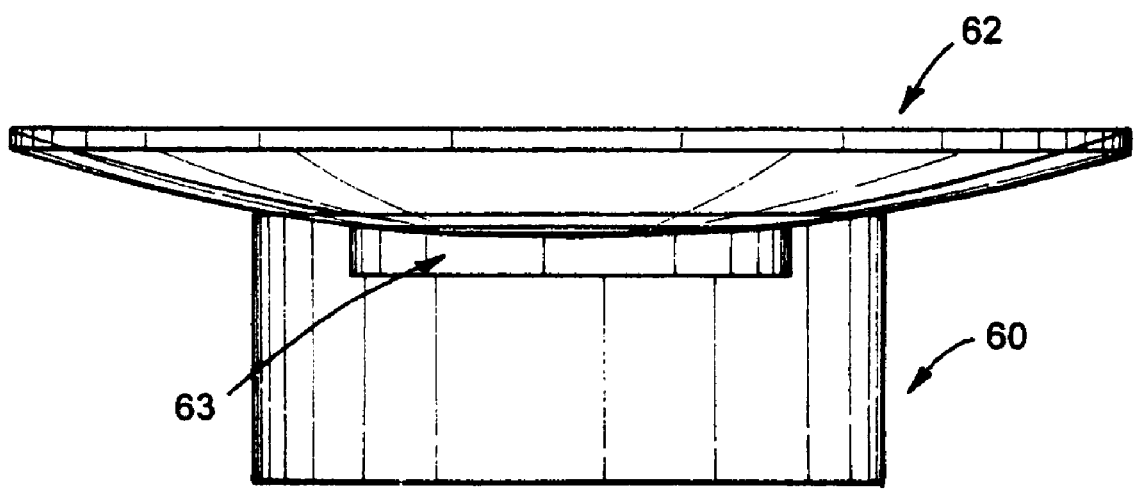
FIG. 4 illustrates a side view of a heat pipe and substrate of an optical device according to another embodiment of the present invention.

FIG. 4 illustrates a side view of a heat pipe and substrate of an optical device according to another embodiment of the present invention. The substrate 62 in its disposed position has a curved surface. The curvature can arise either because the substrate 62 is adequately thin to be able to be elastically bent and adhered to the heat pipe or because it is manufactured with a curved shape and adhered to the heat pipe. The respective contact surface of the heat pipe can have a similar curvature to fit the curved substrate. As illustrated a recess 63 in the contact surface of the heat pipe can be used for disposing thermally conductive adhesive for mechanically and thermally attaching the substrate to the heat pipe or to attach the optical element. Optionally, the substrate can have a correspondingly shaped protrusion for reliable alignment with the heat pipe during positioning. In one embodiment, the curved substrate can be used to preferentially direct the light which is emitted by the light-emitting elements on top of the substrate towards the optical axis of the optical device in order to assist in the shaping of the light beam.

Optical Element

In one embodiment of the present invention, the assembly comprises one or more optical elements. The optical element affects the mixing and propagation of the light emitted by the light-emitting elements. The optical element can be an optical lens, an optical diffuser, optical reflector or any other optical element which can be used for beam shaping as is well known in the art. The optical element is disposed proximate to the light-emitting elements. An additional substance such as an optical coupling gel or adhesive of suitable consistency, mechanical properties, color and refractive index can be disposed between the optical element and the light-emitting elements in order to improve the light-extraction efficiency. The optical element can be mechanically secured to the substrate or alternatively relative to the substrate by a housing or other suitable structural element.

An optical element according to one embodiment of the present invention is illustrated in FIGS. 1 and 2. The optical element 28 can be shaped as a frustoconical reflector having a light exit aperture at the top portion, and a light entrance aperture at the bottom portion that is in optical communication with the light-emitting elements 20 and attached to the evaporator surface of the heat pipe 12. The optical element 28 can be a dielectric totally internally reflecting concentrator which can be manufactured from low-melting glass or plastics using injection-molding techniques, or other similar methods known in the art. Example polymers which are suitable for injection molding include Zeonex™ E48R which can be obtained from Zeon Chemicals L. P. or any other suitable material known in the art.

In one embodiment of the present invention, the optical element includes a reflective sidewall coating which can be fabricated from any one or more materials including thermally conductive materials such as thermoplastic polymer compositions or metals such as aluminum, copper, silver, magnesium, for example. In one embodiment of the present invention, the reflective sidewall of the optical element can be fabricated from a dielectric thin-film stack applied by a sputtering, CVD or ALD means.

Further, in one embodiment, the surfaces of the sidewall of the optical element may be coated with a metalized highly reflective coating or a dielectric multilayer thin-film stack or any combination known in the art. The dielectric stack can be manufactured using ALD so as to deposit accurately thick layers across all surface locations, angles of inclination and curvatures for improved light reflection.

In one embodiment of the present invention, as illustrated in FIGS. 1 and 2, the optical element further comprises a centre portion 32 which may be manufactured as a two-piece first surface reflector that can be made of, for example, an injection-molded polymer, and subsequently coated with a reflecting metal or dielectric coated stack, or a combination thereof. Reflectors and optical elements can be manufactured using polymers with high visible reflectance such as certain Teflon™ containing materials which are commonly used in integrating spheres, for example Spectralon™ or the like.

As illustrated, in one embodiment of the present invention, the centre portion 32 of the optical element can have a rotational symmetric shape around the optical axis of the optical element and define a parabolic or elliptical cross section, for example. An adequately shaped centre portion 32 can improve beam shaping and improve the light-extraction efficiency of the optical device. It is noted that any other shape and cross-section can be used which can aid, for example, in beam shaping and/or extraction of utility light as well as redirecting a portion of light towards optional optical sensors.

In one embodiment of the present invention, an optical sensor is positioned in the central region of the assembly and can be enclosed by the centre portion optical element. In this embodiment, for the transmission of a sample of the light emitted by the light-emitting elements, the centre portion optical element can be configured to capture this portion of light and guide it towards the optical sensor. Optionally, the centre portion optical element can be configured with a transparent window which allows for the passage of a sample of the emitted light to reach the optical sensor. Other configurations of the centre portion optical element for the capturing of a sample of the emitted light, would be readily understood by a worker skilled in the art.

In one embodiment, the inner surface sidewall portion of the optical element and the surface of the centre portion are characterized by having a desired surface texture and smoothness. Down to micrometer or sub-micrometer scales, the surface can be practically considered free of discontinuities, pits, jagged points, or other surface defects. The inner surface can be coated with a metallized reflective coating, which can provide enhanced reflectivity of the optical element and the centre portion.

In another embodiment of the present invention, the optical element may be configured as a reflector such as a compound parabolic concentrator (CFC), an elliptical concentrator (EC), a compound elliptical concentrator (CEC), a color-mixing totally internally reflecting reflector, or a compound hyperbolic concentrator (CHC). Regardless of its type, the optical element may include flat or curved entrance and exit apertures (not illustrated). The apertures can be configured with diffractive surfaces. Curved apertures can have spherical or aspherical surfaces. Optionally, the surfaces of the apertures can be coated with anti-reflective coatings. Anti-reflective coatings can be applied using ion beam sputtering or other techniques as would be known to a worker skilled in the art. In one embodiment of the present invention, the surfaces of the apertures may have diffractive, refractive or sub-wavelength structures which may provide antireflection or wavelength mixing.

Figure 5:
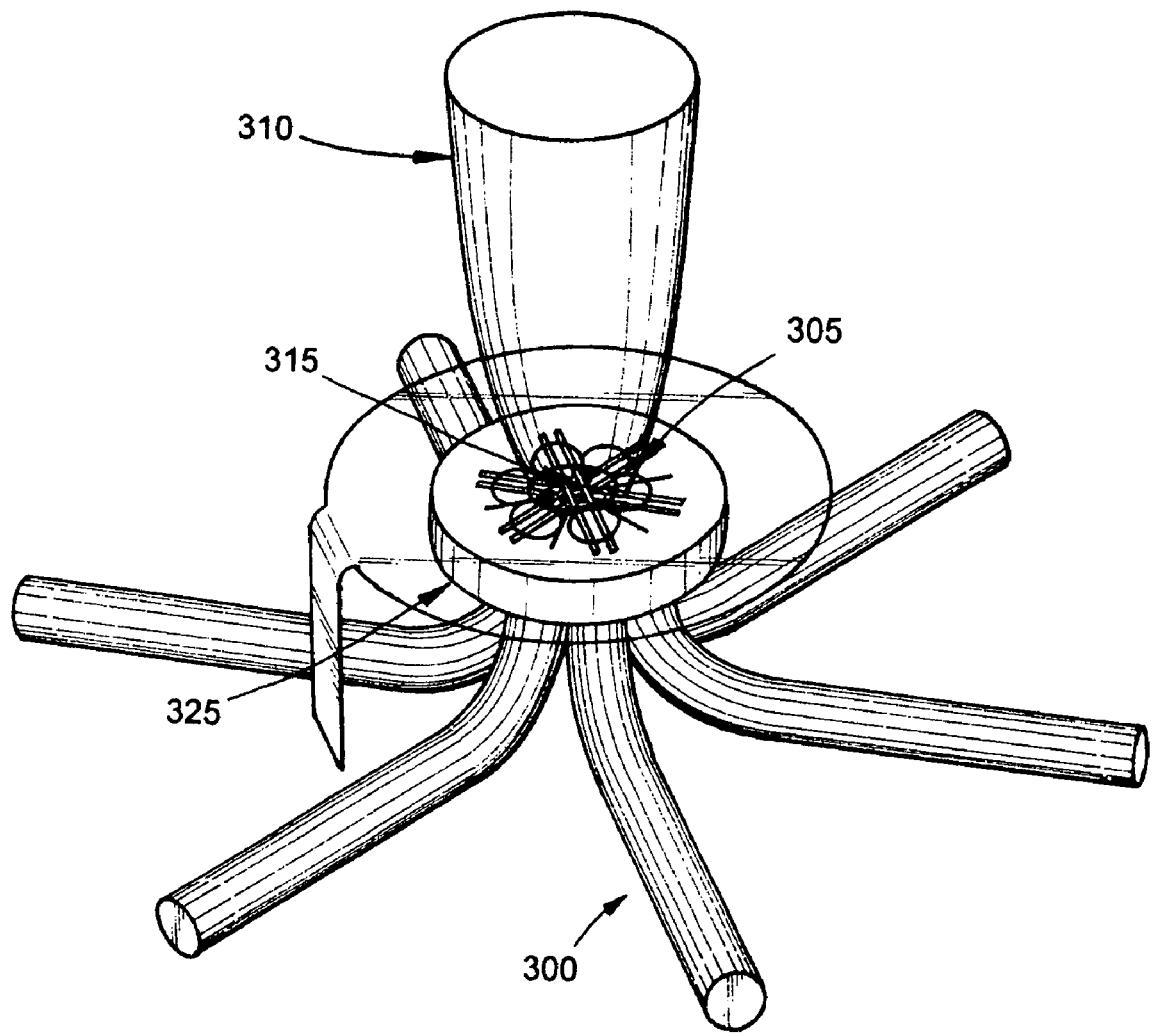
FIG. 5 illustrates a perspective view of an optical device according to another embodiment of the present invention.
Figure 6:
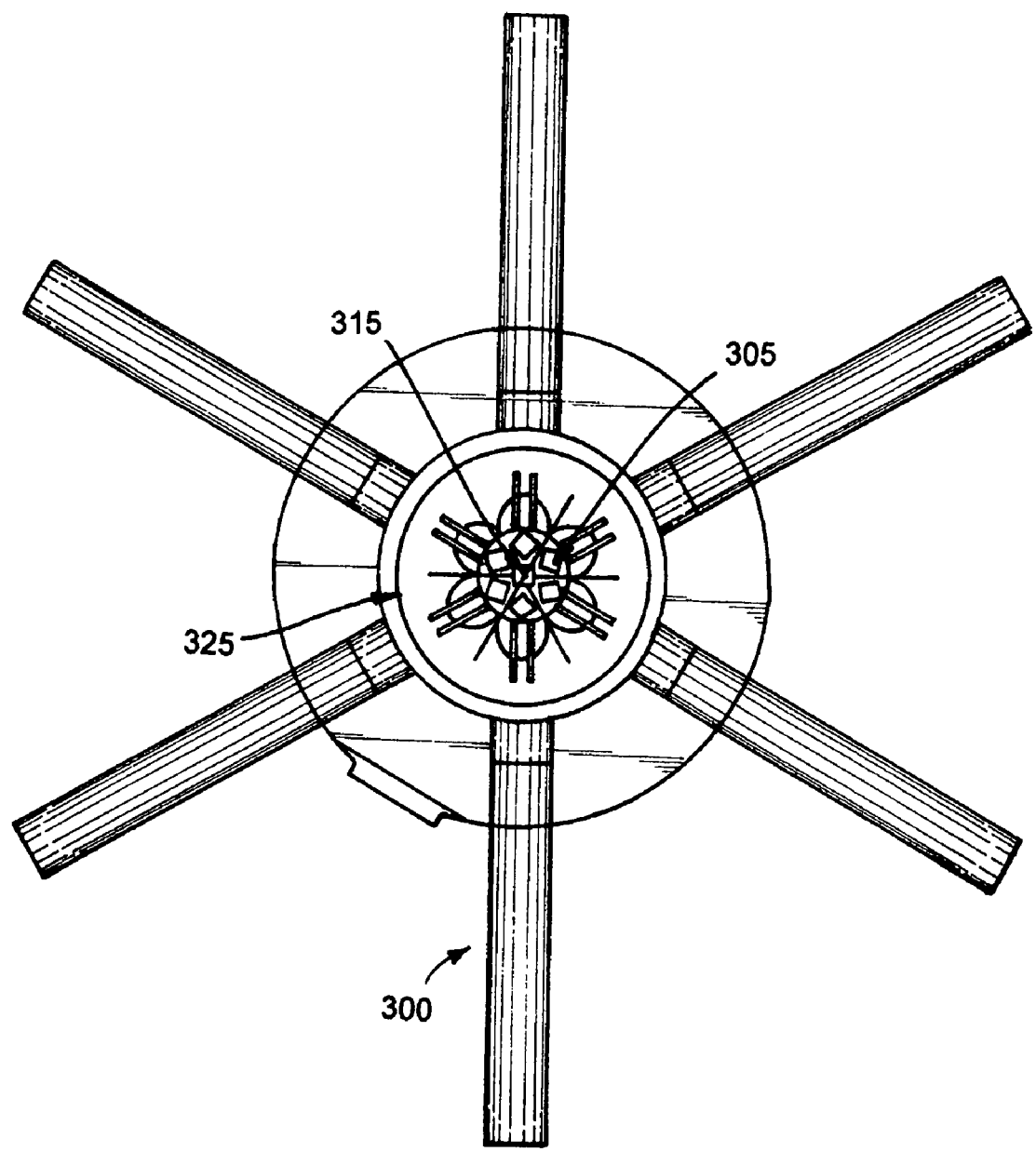
FIG. 6 illustrates a top view of the optical device of FIG. 5.
Figure 7:
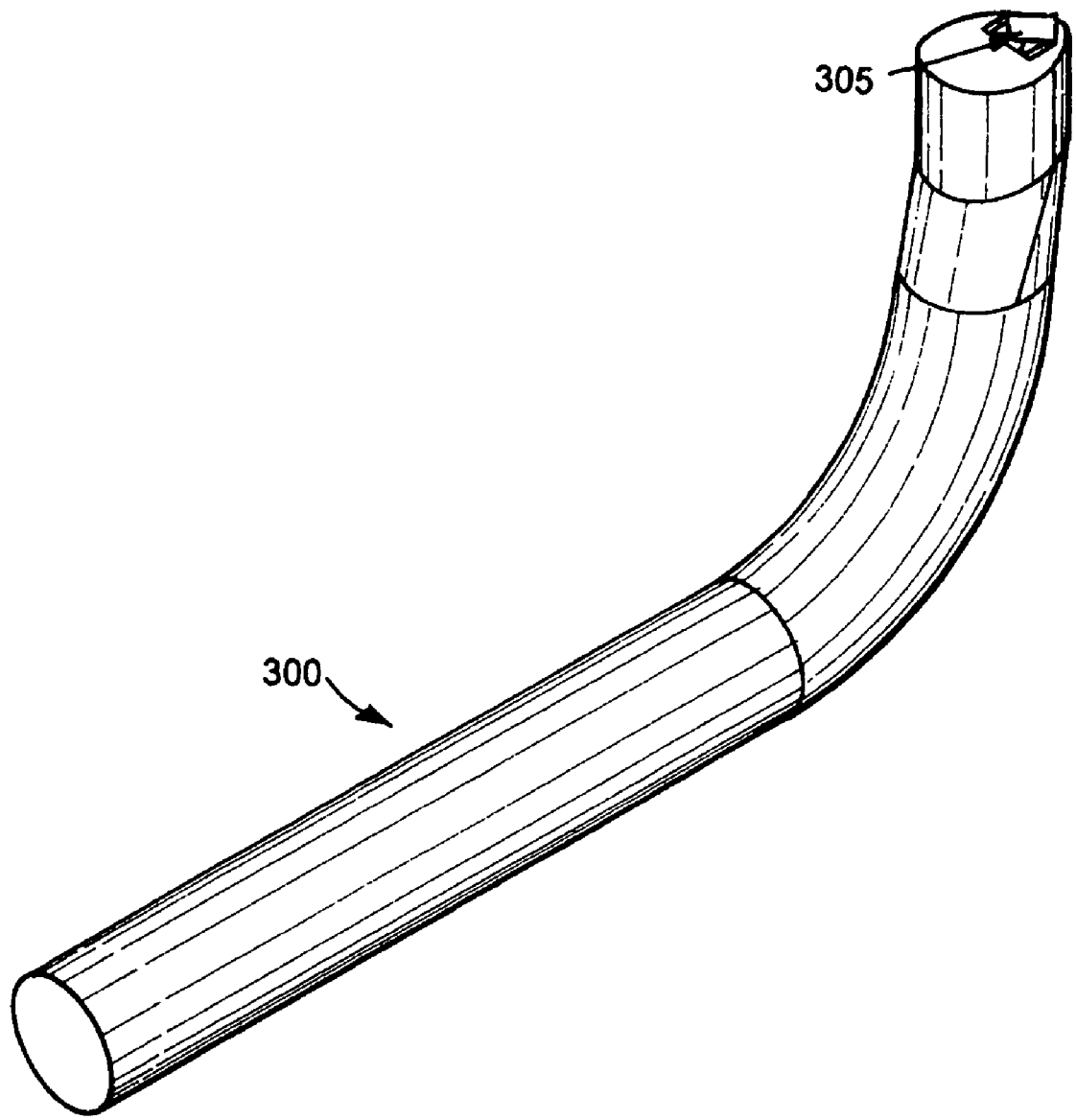
FIG. 7 illustrates a perspective view of a heat pipe and light-emitting element of the optical device of FIG. 5.

FIGS. 5 and 6 illustrate an optical device according to another embodiment of the present invention. The optical device comprises a plurality of heat pipes 300 which have a single substantially 90 degree bend along their length, which can enable the radial separation of the condenser end portions of the heat pipes. As illustrated in FIG. 7, a light-emitting element 305 is thermally coupled to a heat pipe and positioned proximate to the perimeter of the cross section of the heat pipe. In this embodiment, the cross sectional shape of the evaporator end portion of the heat pipe is tear drop, which can enable the relatively close positioning of this end of the heat pipes of the optical device.

As illustrated in FIGS. 5 and 6, the optical device further comprises a substrate 325 which can provide for the operational connectivity of the light-emitting elements 305 of the optical device. Furthermore, an optical sensor 315 is positioned substantially centrally within the optical device, in order that this optical sensor 315 can collect optical information indicative of the operational characteristics of the light-emitting elements 305. In addition, an optical element 310 is optically coupled to the light-emitting elements 305 and can provide for one or more of the redirecting, mixing, collimation and extraction of the light emitted by the light-emitting elements.

In one embodiment of the present invention, the heat pipes have a 6 mm outer diameter, and based on the tear drop shaped evaporator end portion of the heat pipes, six 2 mm light-emitting elements each positioned proximate to the perimeter of the evaporator end portion of a separate heat pipe, can be positioned within a circle which has an outer diameter of about 8.8 mm. In one embodiment, the substrate is a flex circuit comprising cut outs for wire free flip-chip light-emitting elements on laser diced AlN or diamond patterned submounts.

Figure 8:
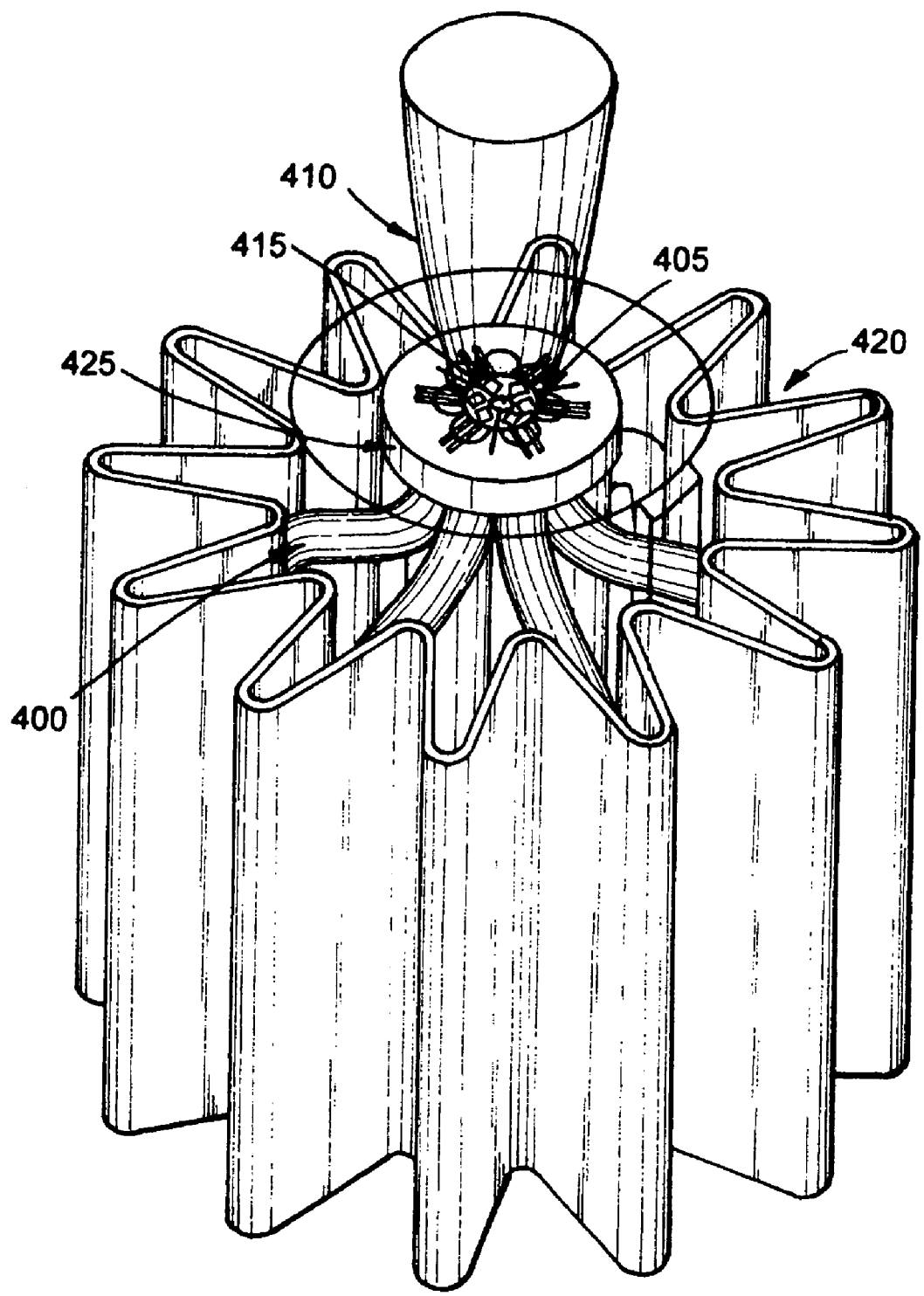
FIG. 8 illustrates a perspective view of an optical device according to another embodiment of the present invention.
Figure 9:
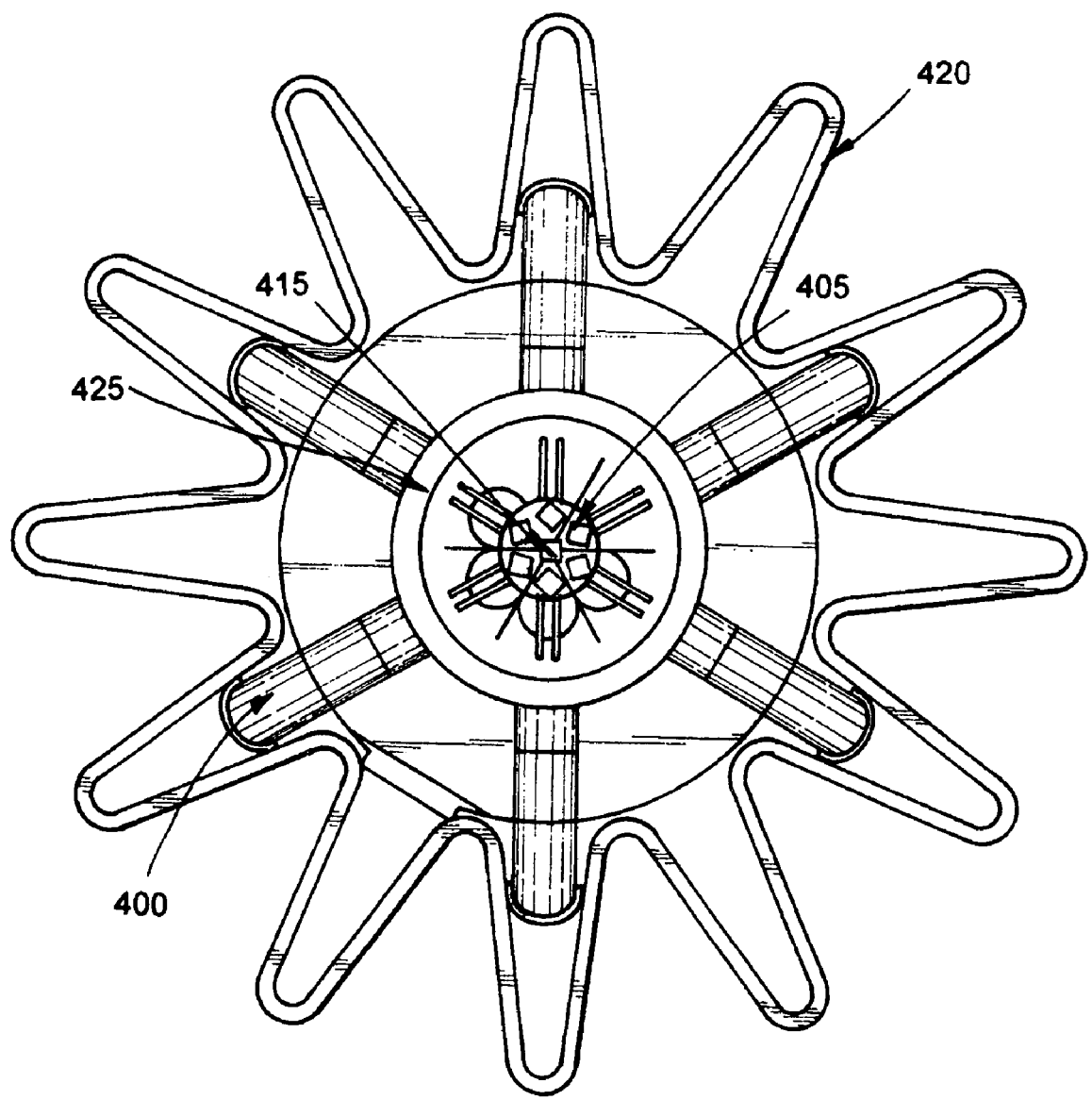
FIG. 9 illustrates a top view of the optical device of FIG. 8.
Figure 10:
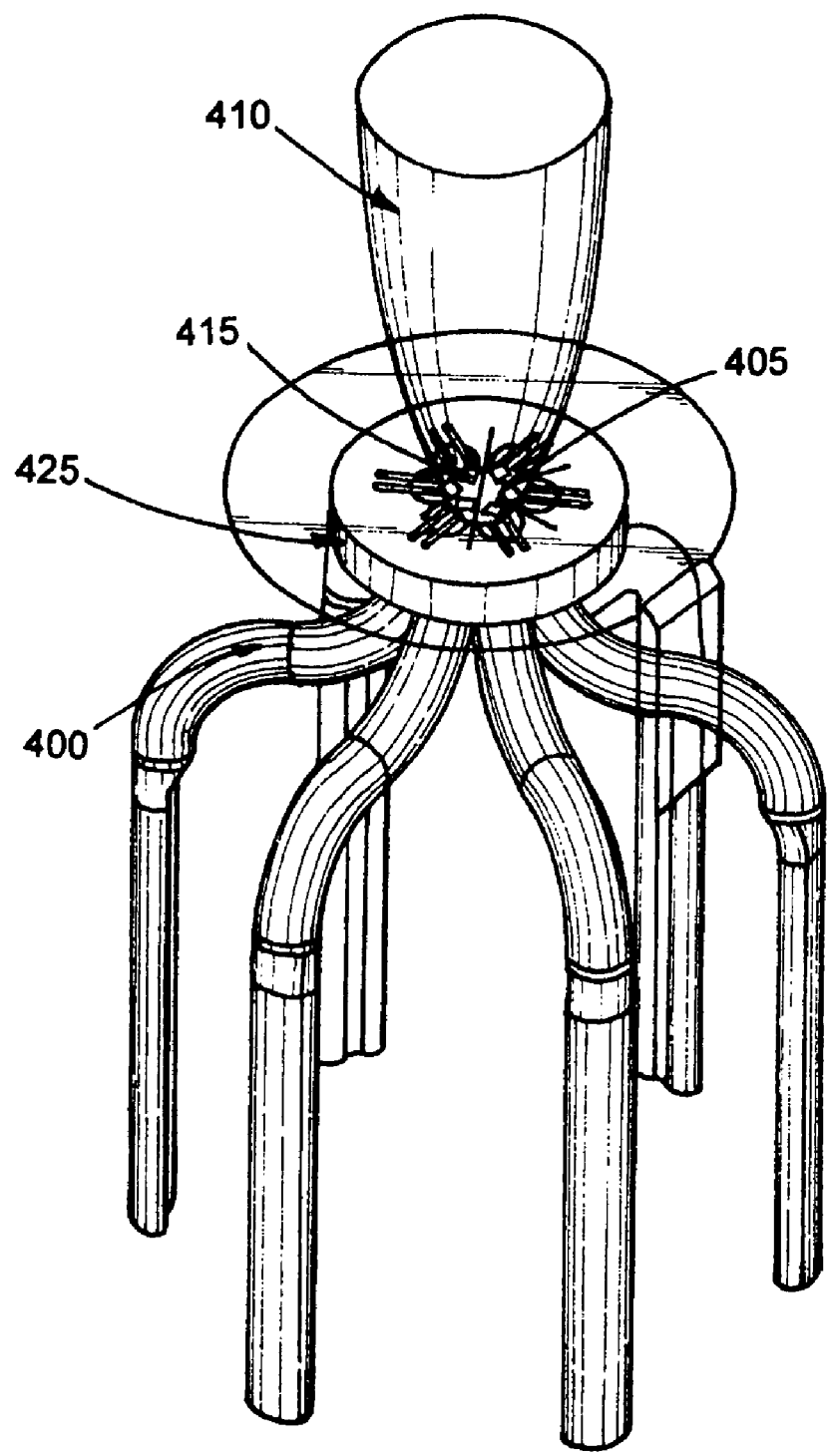
FIG. 10 illustrates a perspective view of a portion of the optical device of FIG. 8.
Figure 11:
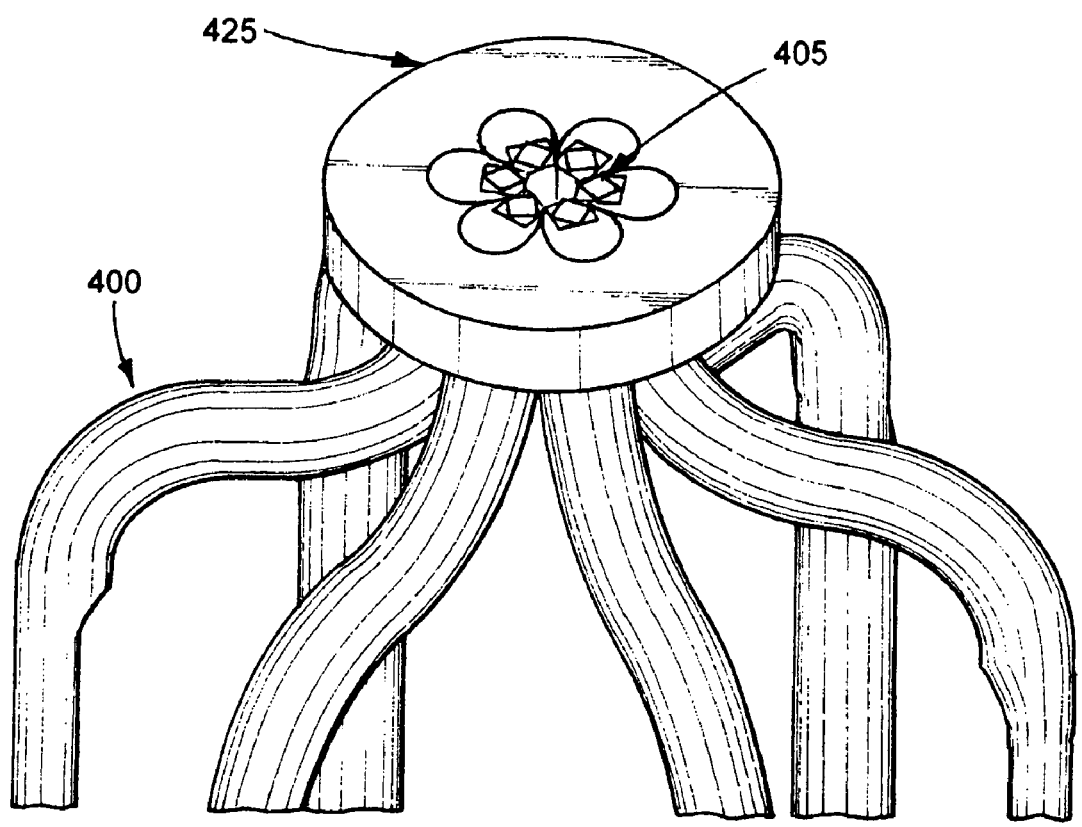
FIG. 11 illustrates a perspective view of a portion of the optical device of FIG. 8.

FIGS. 8 and 9 illustrate an optical device according to another embodiment of the present invention, and FIGS. 10 and 11 illustrate portions of this same optical device. The optical device comprises a plurality of heat pipes 400 which have two substantially 90 degree bends along their length, wherein the first bend can enable the radial separation of the condenser end portions of the heat pipes and the second bend enables these heat pipes to thermally connect with a heat sink 420 having a length aligned with the emission direction of this optical device. In this embodiment of the present invention, the condenser end portion of each of the heat pipes is positioned at a location opposite to that of optical element 410. As illustrated in FIG. 11, a light-emitting element 405 is thermally coupled to a heat pipe and positioned proximate to the perimeter of the cross section of the heat pipe. In this embodiment, the cross sectional shape of the evaporator end portion of the heat pipe is tear drop, which can enable the relatively close positioning of this end of the heat pipes of the optical device.

As illustrated in FIGS. 8 to 11, the optical device further comprises a substrate 425 which can provide for the operational connectivity of the light-emitting elements 405 of the optical device. Furthermore, an optical sensor 415 is positioned substantially centrally within the optical device, in order that this optical sensor 415 can collect optical information indicative of the operational characteristics of the light-emitting elements 405. In addition, an optical element 410 is optically coupled to the light-emitting elements 405 and can provide for one or more of the redirecting, mixing, collimation and extraction of the light emitted by the light-emitting elements.

Figure 12:
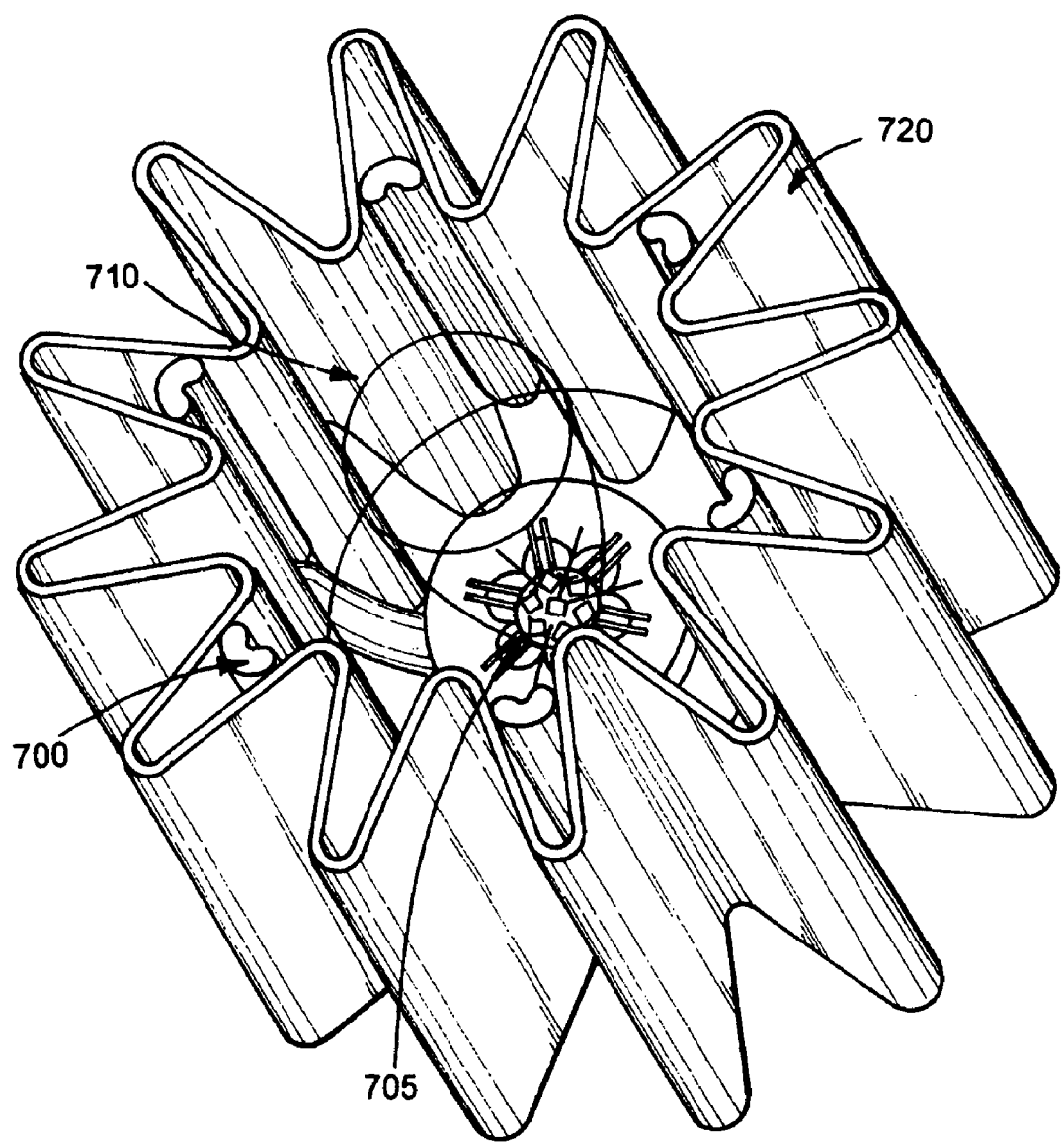
FIG. 12 illustrates a perspective view of an optical device according to another embodiment of the present invention.
Figure 13:
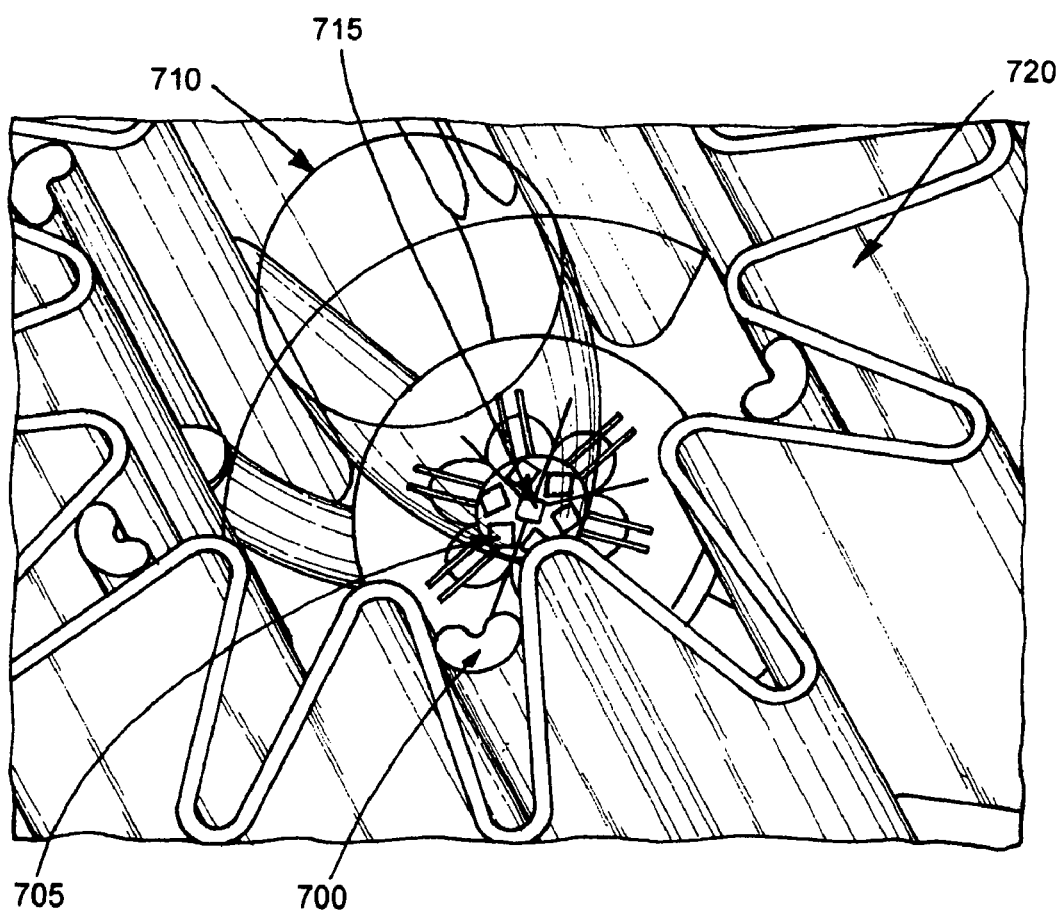
FIG. 13 illustrates a perspective view of a portion of the optical device of FIG. 12.
Figure 14:
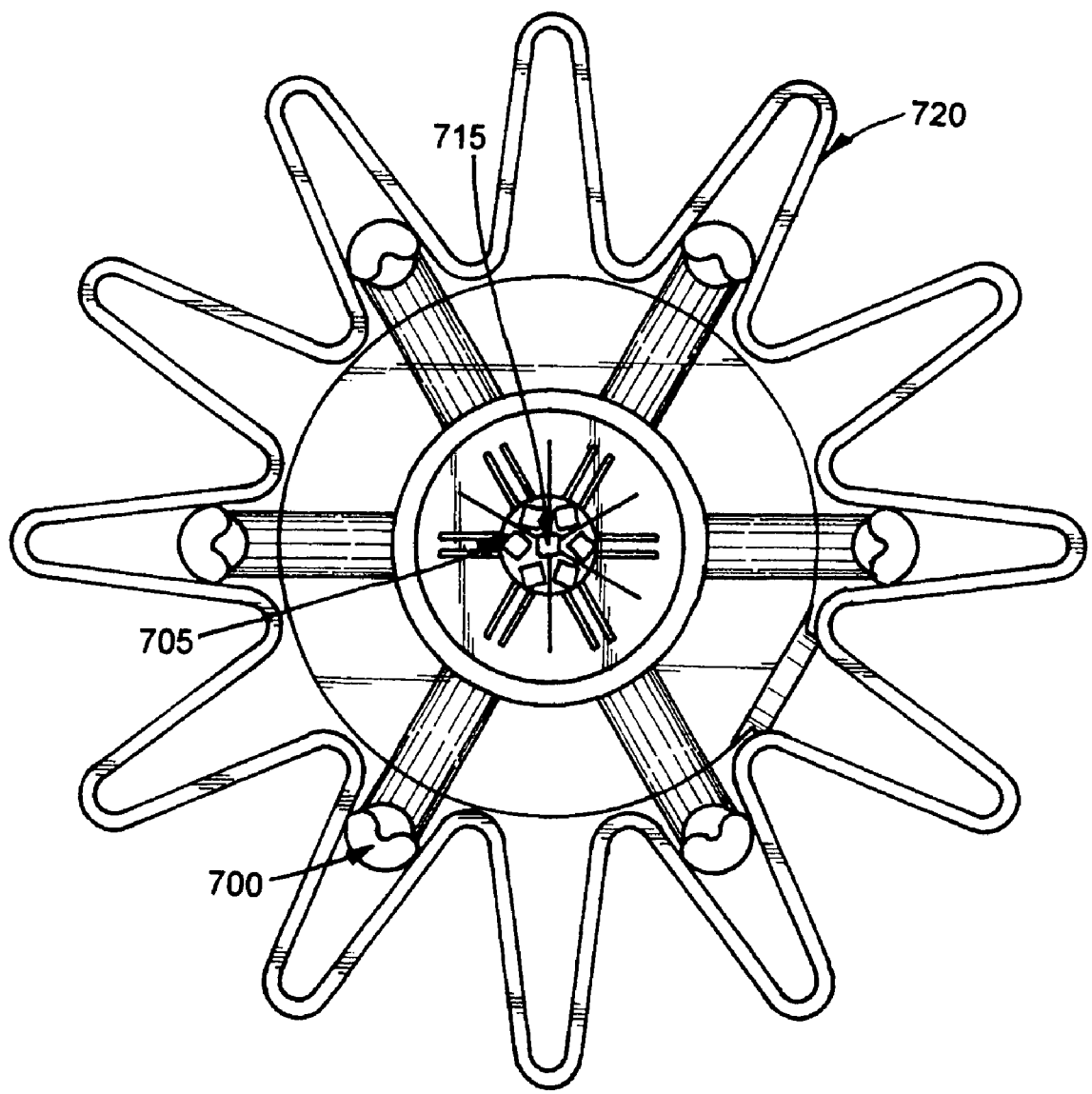
FIG. 14 illustrates a top view of the optical device of FIG. 12.
Figure 15:
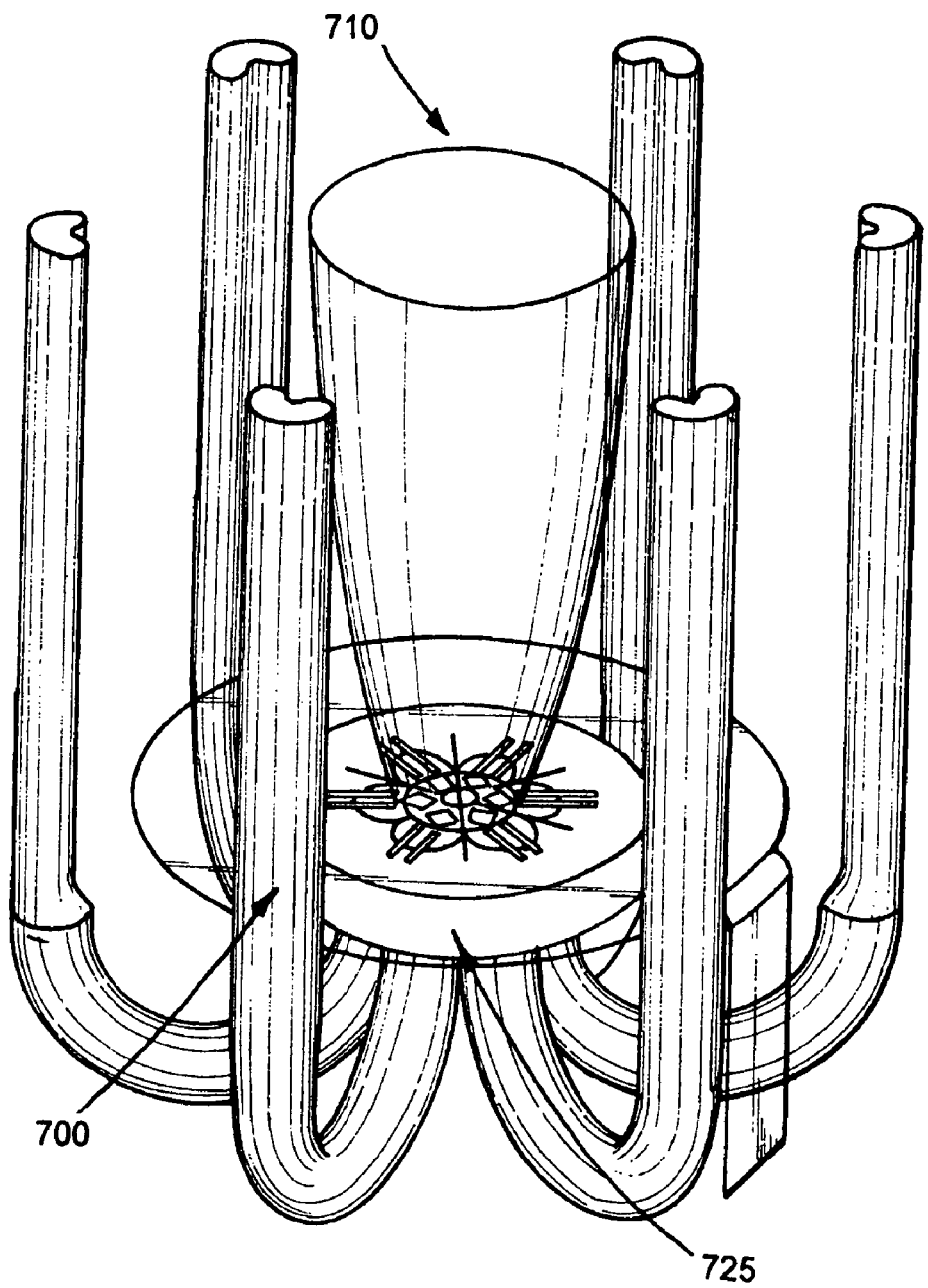
FIG. 15 illustrates a perspective view of a portion of the optical device of FIG. 12.
Figure 16:
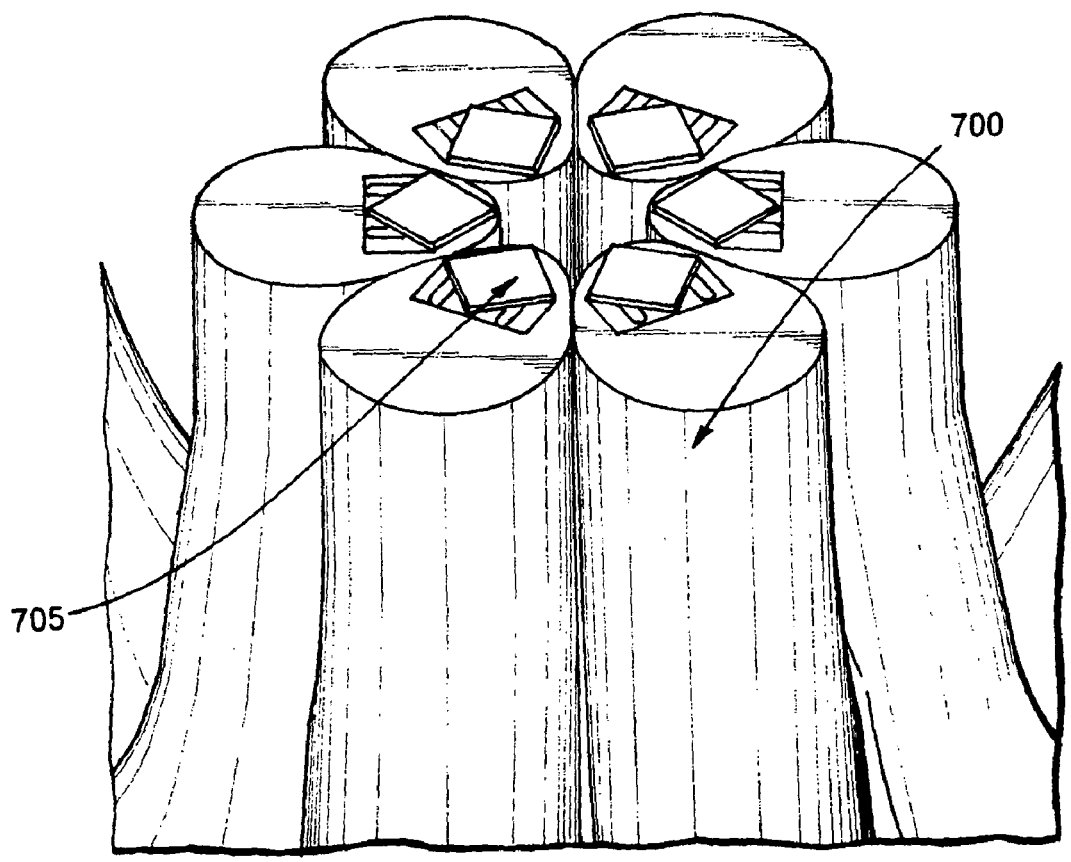
FIG. 16 illustrates a perspective view of a heat pipes and light-emitting element of the optical device of FIG. 12.

FIGS. 12, 13 and 14 illustrate an optical device according to another embodiment of the present invention, and FIGS. 15 and 16 illustrate portions of this same optical device. The optical device comprises a plurality of heat pipes 700 which have one substantially 180 degree bend along their length, wherein the bend can enable the radial separation of the condenser end portions of the heat pipes, while enabling these heat pipes to thermally connect with a heat sink 720 having a length aligned with the emission direction of the optical device. In this embodiment of the present invention, the condenser end portion of each of the heat pipes is positioned in a similar location to that of the optical element 710. As illustrated in FIG. 16, a light-emitting element 705 is thermally coupled to a heat pipe and positioned proximate to the perimeter of the cross section of the heat pipe. In this embodiment, the cross sectional shape of the evaporator end portion of the heat pipe is tear drop, which can enable the relatively close positioning of this end of the heat pipes of the optical device.

As illustrated in FIGS. 12 to 15, the optical device further comprises a substrate 725 which can provide for the operational connectivity of the light-emitting elements 705 of the optical device. Furthermore, an optical sensor 715 is positioned substantially centrally within the optical device, in order that this optical sensor 715 can collect optical information indicative of the operational characteristics of the light-emitting elements 705. In addition, an optical element 710 is optically coupled to the light-emitting elements 705 and can provide for one or more of the redirecting, mixing, collimation and extraction of the light emitted by the light-emitting elements.

Figure 17:
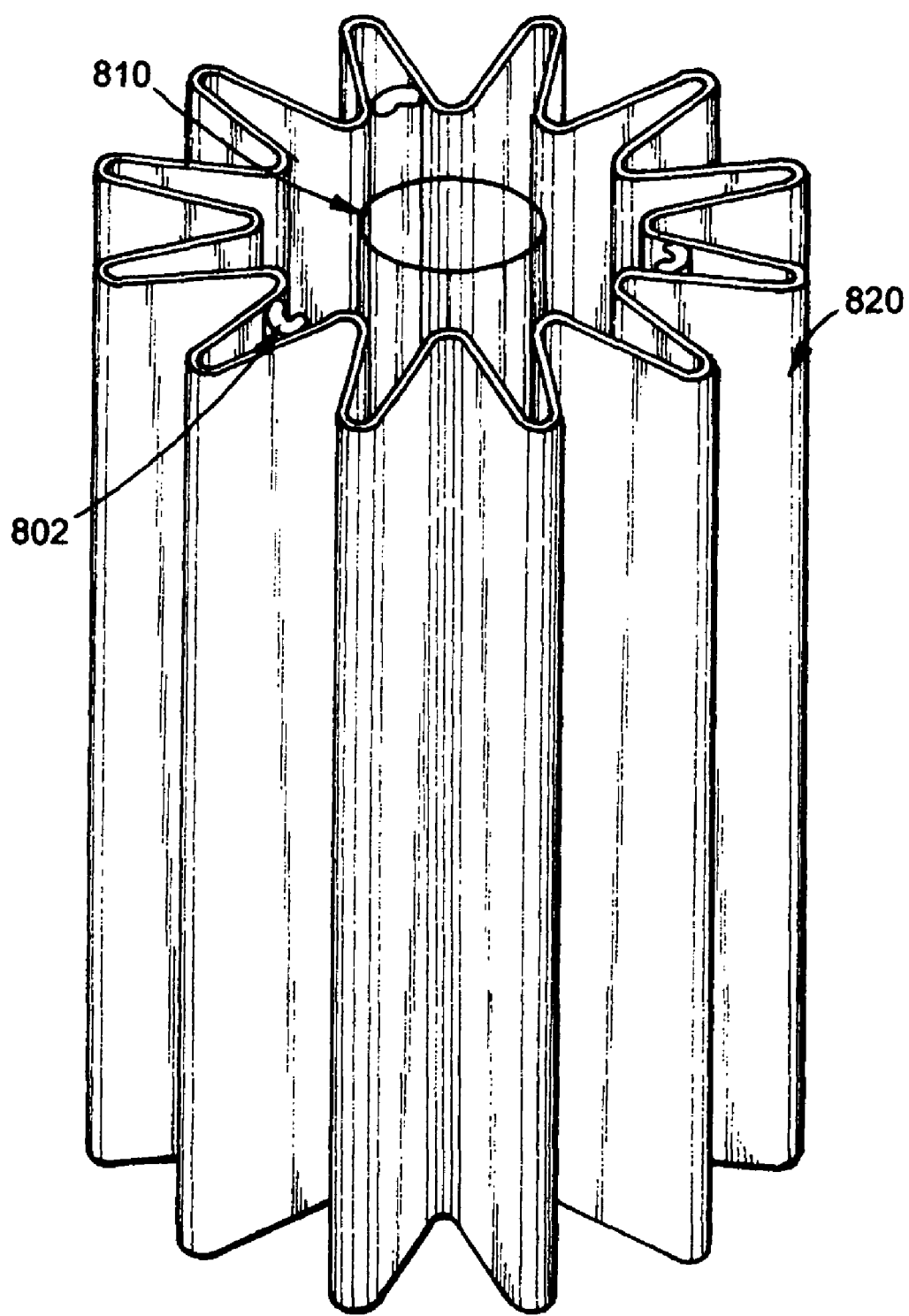
FIG. 17 illustrates a perspective view of an optical device according to another embodiment of the present invention.
Figure 18:
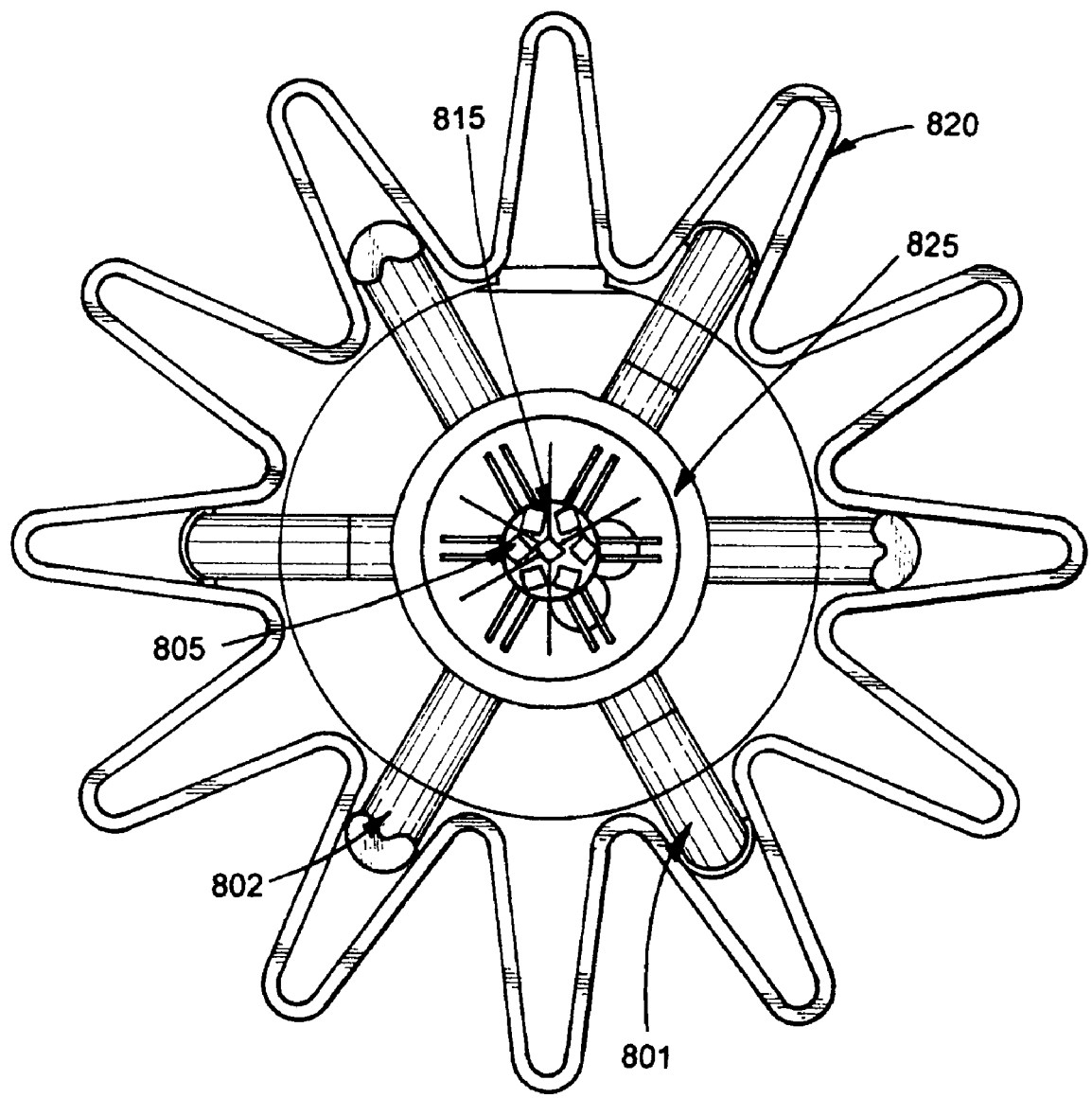
FIG. 18 illustrates a top view of the optical device of FIG. 17.
Figure 19:
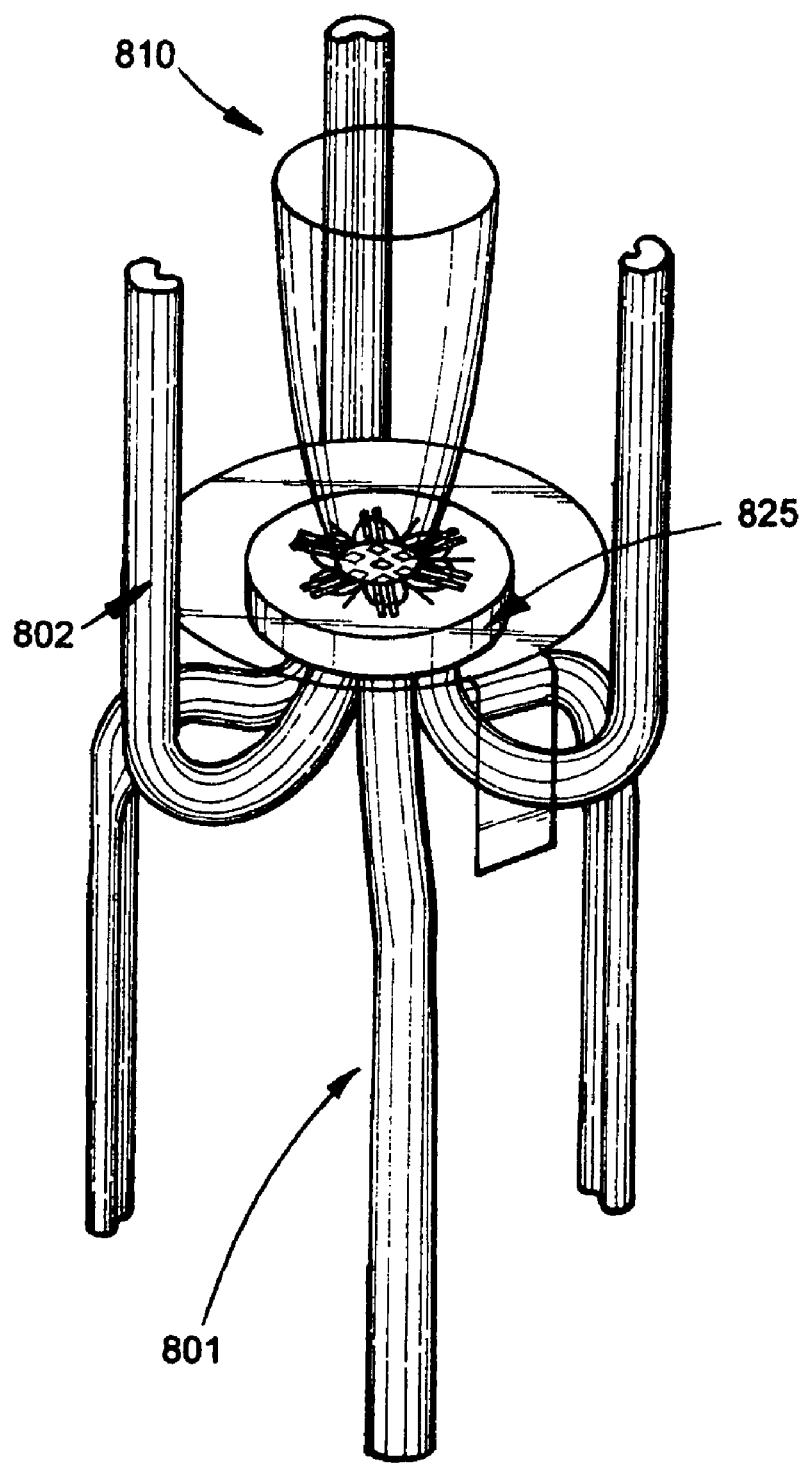
FIG. 19 illustrates a perspective view of a portion of the optical device of FIG. 17.
Figure 20:
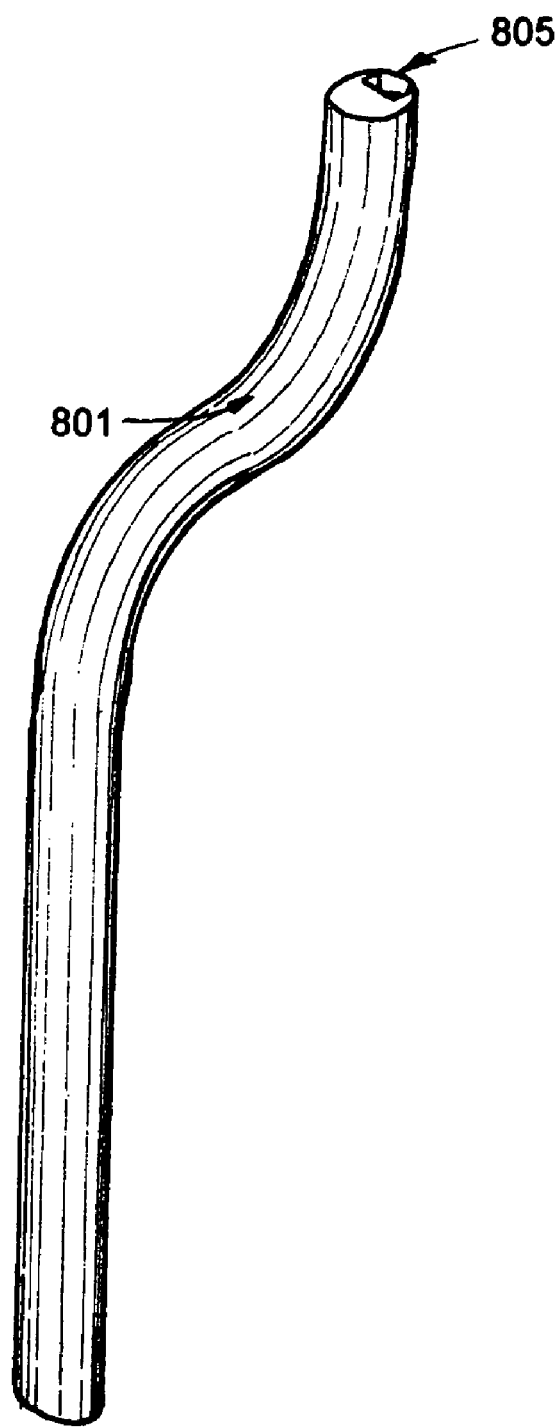
FIG. 20 illustrates a perspective view of a heat pipe and light-emitting element of the optical device of FIG. 17.

FIGS. 17 and 18 illustrate an optical device according to another embodiment of the present invention, and FIGS. 19 and 20 illustrate portions of this same optical device. The optical device comprises a plurality of heat pipes, wherein first heat pipes 801 have two substantially 90 degree bends along their length, wherein the first bend can enable the radial separation of the condenser end portions of the heat pipes and the second bend enables these heat pipes to thermally connect with a heat sink 820 having a length aligned with the emission direction of the optical device, such that the condenser end of these heat pipes is positioned at a location opposite to that of the optical element 810. The second heat pipes 802 have one substantially 180 degree bend along their length, wherein the bend can enable the radial separation of the condenser end portions of the heat pipes, while enabling these heat pipes to thermally connect with the heat sink 820 while the condenser end of each of these heat pipes is positioned at a location similar to that of the optical element 810. As illustrated in FIG. 20, a light-emitting element 805 is thermally coupled to a heat pipe 801 and positioned proximate to the perimeter of the cross section of the heat pipe. A similar thermal coupling and positioning between a light-emitting element and heat pipe 802 is also possible, wherein the evaporator end portion of heat pipe 802 can similarly be tear drop shaped. In this embodiment, the cross sectional shape of the evaporator end portion of each of the heat pipes is tear drop, which can enable the relatively close positioning of this end of the heat pipes of the optical device.

As illustrated in FIGS. 18 and 19, the optical device further comprises a substrate 825 which can provide for the operational connectivity of the light-emitting elements 805 of the optical device. Furthermore, an optical sensor 815 is positioned substantially centrally within the optical device, in order that this optical sensor 815 can collect optical information indicative of the operational characteristics of the light-emitting elements 805. In addition, an optical element 810 is optically coupled to the light-emitting elements 805 and can provide for one or more of the redirecting, mixing, collimation and extraction of the light emitted by the light-emitting elements.

FIGS. 8, 9, 12, 13, 14, 17 and 18 illustrate a heat sink with a corrugated type shaped. Other shapes of the heat sink would be readily understood by a worker skilled in the art. Other possible shapes can include one or more fins or other features which are formed such that the heat sink has sufficient surface area to enable a desired level of heat dissipation to the environment.

Figure 21:
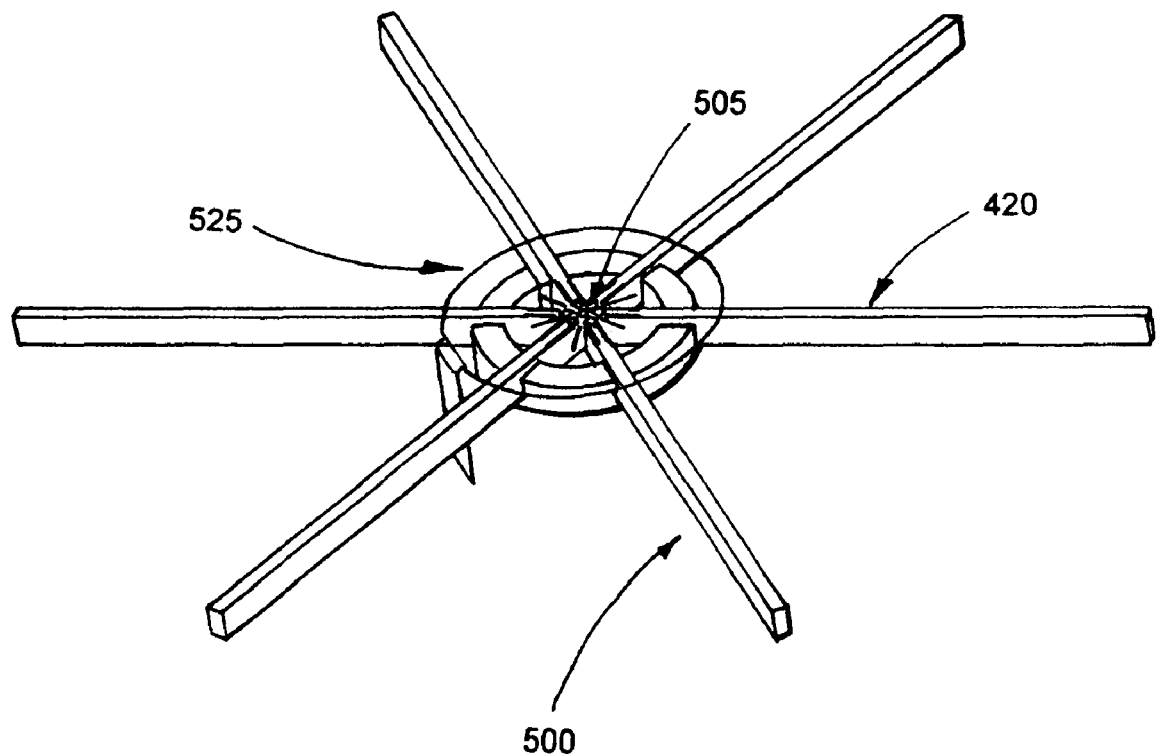
FIG. 21 illustrates a perspective view of a portion of an optical device according to another embodiment of the present invention.
Figure 22:
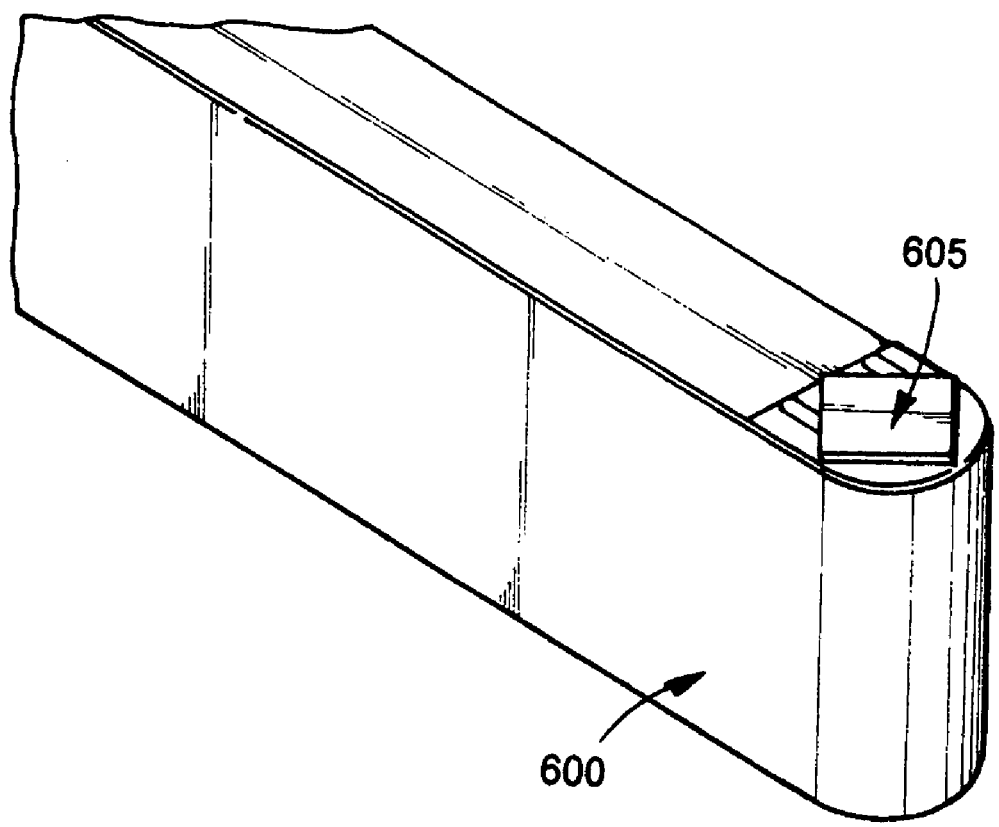
FIG. 22 illustrates a perspective view of a heat pipe and a light-emitting element of the portion of the optical device of FIG. 21.

FIG. 21 illustrates an optical device according to another embodiment of the present invention, and FIG. 22 illustrates a close-up of the evaporator end portion of the heat pipe for this optical device. The optical device comprises a plurality of linear heat pipes 500 wherein the condenser end portions thereof are radially separated. As illustrated in FIG. 22, a light-emitting element 505 is thermally coupled to a heat pipe and positioned on a side thereof. In this embodiment, the tip of the evaporator end portion of the heat pipe is convex, which can enable the relatively close positioning of this end of the heat pipes of the optical device. As illustrated in FIG. 21, the optical device further comprises a substrate 525 which can provide for the operational connectivity of the light-emitting elements 505 of the optical device.

Figure 23:
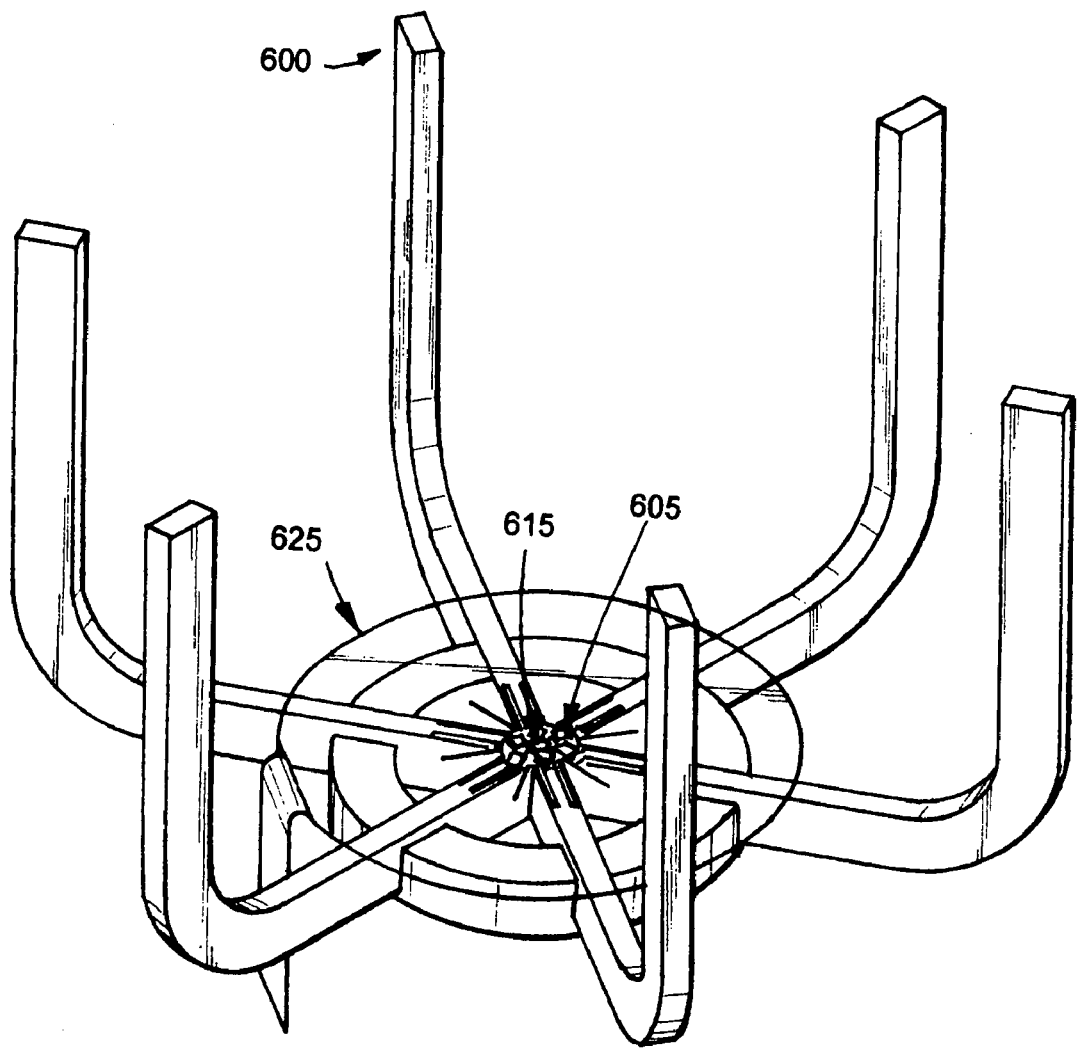
FIG. 23 illustrates a perspective view of a portion of an optical device according to another embodiment of the present invention.

FIG. 23 illustrates an optical device similar to that as illustrated in FIG. 21, however the heat pipes 600 have a substantially 90 degree bend along their length, which may provide a means for thermal connection to a heat sink for example. The optical device further comprises a substrate 625 which can provide for the operational connectivity of the light-emitting elements 605 of the optical device. Furthermore, an optical sensor 615 is positioned substantially centrally within the optical device, in order that this optical sensor 615 can collect optical information indicative of the operational characteristics of the light-emitting elements 605. In addition, an optical element 610 is optically coupled to the light-emitting elements 605 and can provide for one or more of the redirecting, mixing, collimation and extraction of the light emitted by the light-emitting elements.

It is obvious that the foregoing embodiments of the invention are examples and can be varied in many ways. Such present or future variations are not to be regarded as a departure from the spirit and scope of the invention, and all such modifications as would be obvious to one skilled in the art are intended to be included within the scope of the following claims.

We claim:

1. An optical device comprising:
   a plurality of heat pipes, each of the plurality of heat pipes having an evaporator end portion having a perimeter, respectively;
   one or more light-emitting elements configured to generate light, the one or more light-emitting elements operatively and thermally coupled to at least one of the plurality of heat pipes at the perimeter of the evaporator end portion;
   a corrugated heat sink forming a plurality of integral folds extending radially outward relative to a central longitudinal axis of the optical device and each of the plurality of integral folds forming an internal space, wherein at least a portion of each of the plurality of heat pipes is longitudinally disposed within the internal space formed by one of the plurality of integral folds; and
   a plurality of hollow regions each defined by the corrugated heat sink and the portion of a respective one of the plurality of heat pipes.

2. The optical device according to claim 1, further comprising an optical element having a top portion having a first diameter and a bottom portion having a second diameter smaller than the first diameter, said optical element optically coupled to the one or more light-emitting elements.

3. The optical device according to claim 1, wherein the corrugated heat sink is thermally coupled to each of the plurality of heat pipes.

4. The optical device according to claim 1, wherein each of the plurality of heat pipes has a bent configuration.

5. The optical device according to claim 1, wherein each of the plurality of heat pipes has a tear drop cross sectional shape.

6. The optical device according to claim 1, wherein each of the plurality of heat pipes is thermally conductive and electrically passive.

7. The optical device according to claim 1, wherein each of the plurality of heat pipes is thermally conductive and electrically conductive.

8. The optical device according to claim 2, wherein the evaporator end portion comprises a recess configured to mechanically connect with the optical element.

9. The optical device according to claim 1, further comprising a substrate, wherein at least one of the one or more light-emitting elements is positioned on the substrate, said substrate being thermally coupled to each of the plurality of heat pipes.

10. The optical device according to claim 9, wherein the substrate is formed from one or more materials selected from the group comprising silicon, copper plated silicon, aluminum oxide, aluminum nitride, CVD diamond, BeO, GaN, SiC, graphite, diamond coated silicon and ceramic.

11. The optical device according to claim 9, further comprising an optical sensor optically coupled to the one or more light-emitting elements and configured to sense a portion of light generated by the one or more light-emitting elements, wherein the optical sensor is disposed on the substrate in a central region with respect to the longitudinal axis of the optical device.

12. The optical device according to claim 2, wherein the optical element is configured to manipulate light emitted by the one or more light-emitting elements, said manipulation including one or more actions selected from the group comprising redirection, collection and blending.

13. The optical device according to claim 2, wherein the optical element is selected from the group comprising a compound parabolic concentrator, an elliptical concentrator, a compound elliptical concentrator, a colour mixing totally internally reflecting reflector and a compound hyperbolic concentrator.

14. An optical device comprising:
   a plurality of heat pipes each having a evaporator end portion having a perimeter, respectively, and each of the heat pipes having a condenser end portion, respectively, wherein the evaporator end portion of each of the heat pipes has a cross sectional shape configured to enable compact proximate positioning of the evaporator end portion of each of the heat pipes, and wherein each of the plurality of heat pipes is configured to provide spatial separation of each condenser end portion of the heat pipes relative to others of the plurality of heat pipes;
   one or more light-emitting elements configured to generate light, wherein the one or more light-emitting elements are operatively and thermally coupled to at least one of the heat pipes at the perimeter of the evaporator end portion; and a corrugated heat sink forming a plurality of integral folds extending radially outward relative to a central longitudinal axis of the optical device and each of the plurality of integral folds forming an internal space, wherein at least a portion of each of the plurality of heat pipes is longitudinally disposed within the internal space formed by one of the plurality of integral folds; and a plurality of hollow regions each defined by the corrugated heat sink and the portion of a respective one of the plurality of heat pipes.

15. The optical device according to claim 14, wherein each of the evaporator end portions of the plurality of heat pipes are in physical contact.

16. The optical device according to claim 14, wherein one or more of the evaporator end portions of the plurality of heat pipes is physically separated.

17. The optical device according to claim 14, wherein the corrugated heat sink is thermally coupled to one or more of the plurality of heat pipes.

18. The optical device according to claim 14, wherein the one or more of the plurality of heat pipes has a bent configuration.

19. The optical device according to claim 14, wherein the each of the plurality of heat pipes has a tear drop cross sectional shape.

20. The optical device according to claim 14, wherein each of the plurality of heat pipes is thermally conductive and electrically passive.

21. The optical device according to claim 14, wherein each of the plurality of heat pipes is thermally conductive and electrically conductive.

22. The optical device according to claim 14, further comprising a substrate, wherein at least one of the one or more light-emitting elements is positioned on the substrate, said substrate being thermally coupled to one or more of the plurality of heat pipes.

23. The optical device according to claim 22, wherein the substrate is formed from one or more materials selected from the group comprising silicon, copper plated silicon, aluminum oxide, aluminum nitride, CVD diamond, BeO, GaN, SiC, graphite, diamond coated silicon and ceramic.

24. The optical device according to claim 22, further comprising an optical sensor optically coupled to the one or more light-emitting elements and configured to sense a portion of light generated by the one or more light-emitting elements, wherein the optical sensor is disposed in a central region of the substrate.

25. The optical device according to claim 1, wherein the plurality of heat pipes are located in alternate ones of the plurality of integral folds.

* * * * *